United States Patent
Lee et al.

(10) Patent No.: US 9,373,583 B2
(45) Date of Patent: *Jun. 21, 2016

(54) HIGH QUALITY FACTOR FILTER IMPLEMENTED IN WAFER LEVEL PACKAGING (WLP) INTEGRATED DEVICE

(71) Applicant: QUALCOMM Incorporated, San Diego, CA (US)

(72) Inventors: Jong-Hoon Lee, San Diego, CA (US); Young Kyu Song, San Diego, CA (US); Jung Ho Yoon, San Diego, CA (US); Uei Ming Jow, San Diego, CA (US); Xiaonan Zhang, San Diego, CA (US); Ryan David Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/323,907

(22) Filed: Jul. 3, 2014

(65) Prior Publication Data

US 2014/0319652 A1    Oct. 30, 2014

Related U.S. Application Data

(63) Continuation-in-part of application No. 13/787,219, filed on Mar. 6, 2013, now Pat. No. 9,035,421.

(60) Provisional application No. 61/771,717, filed on Mar. 1, 2013.

(51) Int. Cl.
*H01L 27/08* (2006.01)
*H01L 23/522* (2006.01)
(Continued)

(52) U.S. Cl.
CPC ........ *H01L 23/5227* (2013.01); *H01L 23/5223* (2013.01); *H01L 23/645* (2013.01);
(Continued)

(58) Field of Classification Search
CPC ... H01L 23/5227; H01L 23/645; H01L 24/02; H01L 24/81; H01L 25/0657; H01L 25/074

USPC ............... 257/531, E21.022; 438/612–617
See application file for complete search history.

(56) References Cited

U.S. PATENT DOCUMENTS 5,519,582 A   5/1996   Matsuzaki
6,159,817 A   12/2000  Altimari et al.
(Continued)

FOREIGN PATENT DOCUMENTS

JP    H06120036 A      4/1994
JP    2008072121 A     3/2008
WO    WO-2012134666 A1 10/2012

OTHER PUBLICATIONS

International Search Report and Written Opinion—PCT/US2014/017580—ISA/EPO—Jun. 5, 2014.
(Continued)

*Primary Examiner* — Brook Kebede
(74) *Attorney, Agent, or Firm* — Loza & Loza, LLP

(57) ABSTRACT

Some implementations provide an integrated device that includes a capacitor and an inductor. The inductor is electrically coupled to the capacitor. The inductor and the capacitor are configured to operate as a filter for an electrical signal in the integrated device. The inductor includes a first metal layer of a printed circuit board (PCB), a set of solder balls coupled to the PCB, and a second metal layer in a die. In some implementations, the capacitor is located in the die. In some implementations, the capacitor is a surface mounted passive device on the PCB. In some implementations, the first metal layer is a trace on the PCB. In some implementations, the inductor includes a third metal layer in the die. In some implementations, the second metal layer is an under bump metallization (UBM) layer of the die, and the third metal is a redistribution layer of the die.

45 Claims, 26 Drawing Sheets

(51) Int. Cl.
  *H01L 49/02* (2006.01)
  *H01L 23/64* (2006.01)
  *H01L 25/065* (2006.01)
  *H01L 25/07* (2006.01)
  *H01L 25/11* (2006.01)
  *H01L 23/00* (2006.01)
  *H01L 25/03* (2006.01)
  *H01L 23/525* (2006.01)

(52) U.S. Cl.
  CPC ............ *H01L 24/02* (2013.01); *H01L 25/03* (2013.01); *H01L 25/0657* (2013.01); *H01L 25/074* (2013.01); *H01L 25/117* (2013.01); *H01L 28/10* (2013.01); *H01L 28/40* (2013.01); *H01L 23/525* (2013.01); *H01L 24/03* (2013.01); *H01L 24/05* (2013.01); *H01L 24/11* (2013.01); *H01L 24/13* (2013.01); *H01L 24/16* (2013.01); *H01L 2224/0239* (2013.01); *H01L 2224/02375* (2013.01); *H01L 2224/0345* (2013.01); *H01L 2224/0346* (2013.01); *H01L 2224/03452* (2013.01); *H01L 2224/03616* (2013.01); *H01L 2224/0401* (2013.01); *H01L 2224/05569* (2013.01); *H01L 2224/05647* (2013.01); *H01L 2224/131* (2013.01); *H01L 2224/13147* (2013.01); *H01L 2224/16225* (2013.01); *H01L 2224/16227* (2013.01); *H01L 2224/81447* (2013.01); *H01L 2924/15788* (2013.01)

(56) References Cited

U.S. PATENT DOCUMENTS

| | | | |
|---|---|---|---|
| 6,278,264 B1 * | 8/2001 | Burstein | ............ H01L 23/5386 257/700 |
| 7,339,452 B2 | 3/2008 | Lee | |
| 7,786,837 B2 | 8/2010 | Hebert | |
| 7,994,888 B2 | 8/2011 | Ikriannikov | |
| 8,212,155 B1 | 7/2012 | Wright et al. | |
| 8,558,344 B2 | 10/2013 | Chen | |
| 9,035,421 B2 * | 5/2015 | Song | ................... H01L 23/5227 257/531 |
| 2004/0150968 A1 | 8/2004 | Ravid et al. | |
| 2006/0220210 A1 | 10/2006 | Karnezos et al. | |
| 2007/0018767 A1 | 1/2007 | Gabara et al. | |
| 2007/0268105 A1 | 11/2007 | Walls | |
| 2008/0001287 A1 | 1/2008 | Nakashiba | |
| 2008/0061420 A1 | 3/2008 | Degani et al. | |
| 2008/0265367 A1 | 10/2008 | Tan et al. | |
| 2008/0315356 A1 * | 12/2008 | Reisner | ................. H01L 23/481 257/531 |
| 2009/0085704 A1 | 4/2009 | Theuss | |
| 2009/0302436 A1 | 12/2009 | Kim et al. | |
| 2010/0026368 A1 | 2/2010 | Tang et al. | |
| 2010/0314737 A1 | 12/2010 | Henderson et al. | |
| 2011/0012228 A1 | 1/2011 | Nakagawa et al. | |
| 2011/0170231 A1 | 7/2011 | Chandrasekaran et al. | |
| 2011/0291232 A1 | 12/2011 | Yen et al. | |
| 2011/0317387 A1 | 12/2011 | Pan et al. | |
| 2012/0126369 A1 | 5/2012 | Lin et al. | |
| 2012/0175732 A1 | 7/2012 | Lin et al. | |
| 2012/0187531 A1 | 7/2012 | Lee et al. | |
| 2012/0228755 A1 | 9/2012 | Nagano et al. | |
| 2013/0020675 A1 | 1/2013 | Kireev et al. | |
| 2013/0037924 A1 | 2/2013 | Lee et al. | |
| 2014/0246753 A1 | 9/2014 | Song et al. | |

OTHER PUBLICATIONS

International Search Report and Written Opinion—PCT/US2015/038895—ISA/EPO—Oct. 7, 2015.

* cited by examiner

Semi-Additive Patterning (SAP) Process

Damascene Process

HIGH QUALITY FACTOR FILTER IMPLEMENTED IN WAFER LEVEL PACKAGING (WLP) INTEGRATED DEVICE

CLAIM OF PRIORITY

The present application is a continuation in part application to U.S. patent application Ser. No. 13/787,219, titled "High Quality Factor Inductor Implemented in Wafer Level Packaging (WLP)", filed Mar. 6, 2013. U.S. patent application Ser. No. 13/787,219 claims priority to U.S. Provisional Application No. 61/771,717 titled "High Quality Factor Inductor Implemented in Wafer Level Packaging (WLP)", filed Mar. 1, 2013. Both applications are hereby expressly incorporated by reference herein.

BACKGROUND

1. Field

Various features relate to a high quality factor filter implemented in wafer level packaging (WLP) integrated device.

2. Background

Inductors that are located in integrated circuit (IC) packages are limited in their capabilities for supporting high current due to the limited real estate in IC packages. Specifically, since these inductors are located in the packaging substrate of IC packages, the size of these inductors is limited by the size of the packaging substrate of IC packages. As a result of the restricted space in the packaging substrate of IC packages, these inductors typically have a high resistance and a low quality (Q) factor. FIG. 1 conceptually illustrates a semiconductor device that includes an inductor. Specifically, FIG. 1 illustrates a die 100, a packaging substrate 102, a set of solder balls 104, a printed circuit board (PCB) 106, and an inductor 108. As shown in FIG. 1, the die 100 is coupled to the packaging substrate 102. The packaging substrate 102 is coupled to the PCB 106 through the set of solder balls 104. The inductor 108 is defined and located in the die 100.

FIG. 1 also illustrates that some solder balls have been omitted/removed in a region near the inductor 108. This is because solder balls can affect/disrupt the performance of an inductor. More specifically, solder balls that are near an inductor can disrupt the magnetic flux of an inductor, resulting in a low inductance and low Q factor for the inductor, which is why solder balls are removed in a region near an inductor. However, removing solder balls between a packaging substrate and a PCB can affect the structural stability of the packaging substrate and the PCB. Thus, current IC design must weigh the benefit of removing solder balls (e.g., better inductance and Q factor inductor) versus the disadvantage of removing solder balls (e.g., less stable packaging substrate/PCB structure), when determining how many solder balls to use and where to put solder balls when coupling a die and packaging substrate to a PCB.

Therefore, there is a need for an improved inductor design for integrated devices. Ideally, such an inductor will have better inductance performance, lower resistance and better quality factor value, without having to sacrifice the structural stability of the semiconductor device. Moreover, such an inductor may be used as part of a filter with a high quality factor value.

SUMMARY

Various features relate to a high quality filter inductor implemented in wafer level packaging (WLP) integrated device.

A first example provides an integrated device that includes a capacitor and an inductor. The inductor is electrically coupled to the capacitor. The inductor and the capacitor are configured to operate as a filter for an electrical signal in the integrated device. The inductor includes a first metal layer of a printed circuit board (PCB), a set of solder balls coupled to the PCB, and a second metal layer in a die.

According to an aspect, the capacitor is located in the die.

According to one aspect, the capacitor is one of at least a metal-insulator-metal (MIM) capacitor, and/or metal-on-metal (MOM) capacitor.

According to an aspect, the capacitor is a surface mounted passive device on the PCB.

According to one aspect, the first metal layer is a trace on the PCB.

According to an aspect, the second metal layer is an under bump metallization (UBM) layer of the die.

According to one aspect, the inductor further includes a third metal layer in the die.

According to an aspect, the second metal layer is an under bump metallization (UBM) layer of the die, and the third metal is a redistribution layer of the die.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a passive means and an inductor. The passive means is configured to store energy. The inductor is electrically coupled to the passive means. The inductor and the passive means are configured to operate as a filter for an electrical signal in the integrated device. The inductor includes a first metal layer of a printed circuit board (PCB), a set of solder balls coupled to the PCB, a second metal layer in a die.

According to an aspect, the passive means is located in the die.

According to one aspect, the passive means is one of at least a metal-insulator-metal (MIM) capacitor, and/or metal-on-metal (MOM) capacitor.

According to an aspect, the passive means is a surface mounted passive device on the PCB.

According to one aspect, the first metal layer is a trace on the PCB.

According to an aspect, the second metal layer is an under bump metallization (UBM) layer of the die.

According to one aspect, the inductor includes a third metal layer in the die.

According to an aspect, the second metal layer is an under bump metallization (UBM) layer of the die, and the third metal is a redistribution layer of the die.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for fabricating an integrated device. The method provides a capacitor. The method provides an inductor such that the inductor is electrically coupled to the capacitor. The inductor and the capacitor are configured to operate as a filter for an electrical signal in the integrated device. The method of providing the inductor includes forming a first metal layer of a printed circuit board (PCB). The method of providing the inductor includes providing a set of solder balls coupled to the PCB. The method of providing the inductor includes forming a second metal layer in a die.

According to an aspect, the capacitor is located in the die.

According to one aspect, the capacitor is one of at least a metal-insulator-metal (MIM) capacitor, and/or metal-on-metal (MOM) capacitor.

According to an aspect, the capacitor is a surface mounted passive device on the PCB.

According to one aspect, the first metal layer is a trace on the PCB.

According to an aspect, the second metal layer is an under bump metallization (UBM) layer of the die.

According to one aspect, providing the inductor further comprises forming a third metal layer in the die.

According to an aspect, the second metal layer is an under bump metallization (UBM) layer of the die, and the third metal is a redistribution layer of the die.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides an integrated device that includes a capacitor and an inductor. The inductor is electrically coupled to the capacitor. The inductor and the capacitor are configured to operate as a filter for an electrical signal in the integrated device. The inductor includes a first metal layer of a substrate, a set of solder balls coupled to the substrate, and a second metal layer in a die.

According to an aspect, the capacitor is located in the die.

According to one aspect, the capacitor is one of at least a metal-insulator-metal (MIM) capacitor, and/or metal-on-metal (MOM) capacitor.

According to an aspect, the capacitor is a surface mounted passive device on the substrate.

According to one aspect, the first metal layer is a trace on the substrate.

According to an aspect, the substrate is one of at least a package substrate and/or an interposer.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fifth example provides an apparatus that includes a passive means and an inductor. The passive means is configured to store energy. The inductor is electrically coupled to the passive means. The inductor and the passive means are configured to operate as a filter for an electrical signal in the integrated device. The inductor includes a first metal layer of a substrate, a set of solder balls coupled to the substrate, a second metal layer in a die.

According to an aspect, the passive means is located in the die.

According to one aspect, the passive means is one of at least a metal-insulator-metal (MIM) capacitor, and/or metal-on-metal (MOM) capacitor.

According to an aspect, the passive means is a surface mounted passive device on the substrate.

According to one aspect, the substrate is one of at least a package substrate and/or an interposer.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A sixth example provides a method for fabricating an integrated device. The method provides a capacitor. The method provides an inductor such that the inductor is electrically coupled to the capacitor. The inductor and the capacitor are configured to operate as a filter for an electrical signal in the integrated device. The method of providing the inductor includes forming a first metal layer of a substrate. The method of providing the inductor includes providing a set of solder balls coupled to the substrate. The method of providing the inductor includes forming a second metal layer in a die.

According to an aspect, the capacitor is located in the die.

According to one aspect, the capacitor is one of at least a metal-insulator-metal (MIM) capacitor, and/or metal-on-metal (MOM) capacitor.

According to an aspect, the capacitor is a surface mounted passive device on the substrate.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some implementations provide an integrated device that includes a capacitor and an inductor. The inductor is electrically coupled to the capacitor. The inductor and the capacitor are configured to operate as a filter for an electrical signal in the integrated device. The inductor includes a first metal layer of a printed circuit board (PCB), a set of solder balls coupled to the PCB, and a second metal layer in a die. In some implementations, a capacitor is a passive means configured to store energy (e.g., store energy electrostatically in an electric field). In some implementations, the capacitor is located in the die. In some implementations, the capacitor is one of at least a metal-insulator-metal (MIM) capacitor, and/or metal-on-metal (MOM) capacitor. In some implementations, the capacitor is a surface mounted passive device on the PCB. In some implementations, the first metal layer is a trace on the PCB. In some implementations, the second metal layer is an under bump metallization (UBM) layer of the die. In some implementations, the inductor includes a third metal layer in the die. In some implementations, the second metal layer is an under bump metallization (UBM) layer of the die, and the third metal is a redistribution layer of the die.

Some implementations provide an integrated device that includes a capacitor and an inductor. The inductor is electrically coupled to the capacitor. The inductor and the capacitor are configured to operate as a filter for an electrical signal in the integrated device. The inductor includes a first metal layer of a substrate, a set of solder balls coupled to the substrate, and a second metal layer in a die.

TERMS AND DEFINITIONS

An interconnect is an element or component that allows or facilitates an electrical connection between two points, elements and/or components. In some implementations, an interconnect may include a trace, a via, a pad, a pillar, a redistribution layer, an under bump metallization (UBM) layer, and/or solder (e.g., solder balls). In some implementations, an interconnect is an electrically conductive material that provides an electrical path for a signal (e.g., data signal, ground signal, power signal). An interconnect may include one element/component or several elements/components that provide an electrical path for a signal.

Exemplary Integrated Device Comprising Inductor and Capacitor

Figure 1:
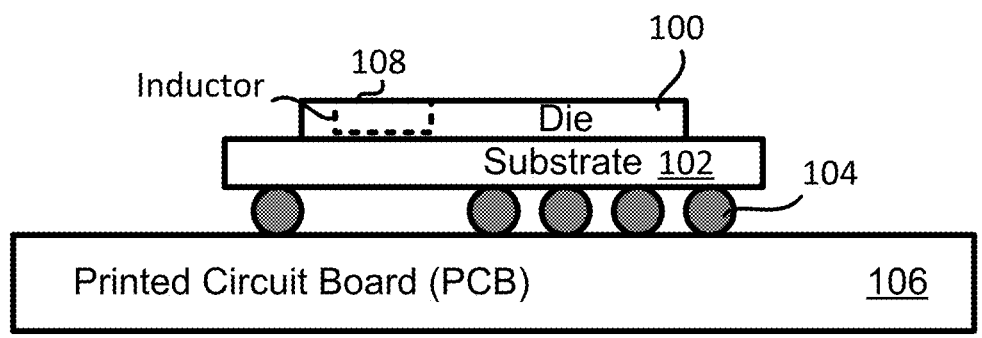
FIG. 1 illustrates a known inductor integrated in a die.
Figure 2:
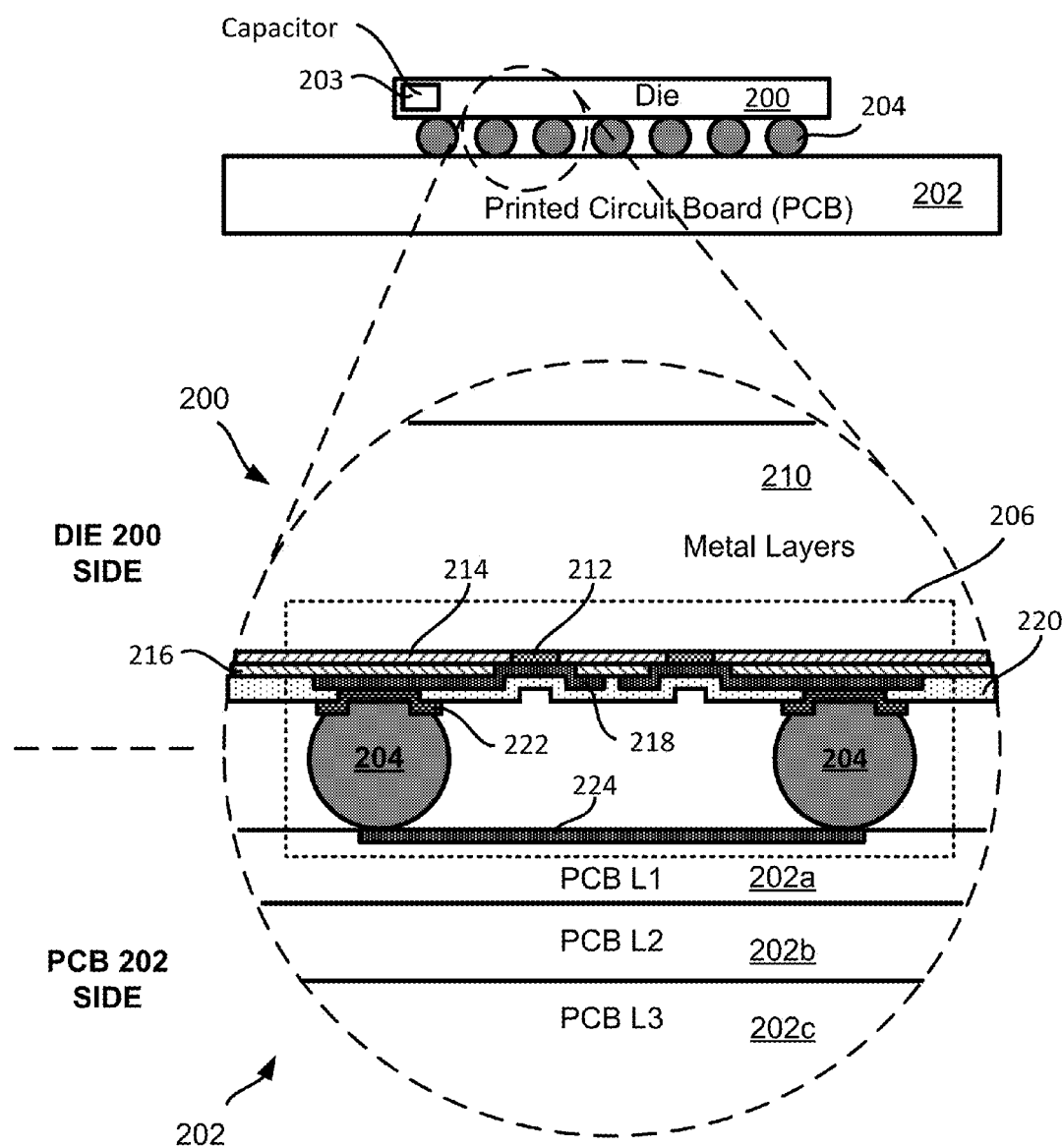
FIG. 2 illustrates an inductor defined between a die and a printed circuit board (PCB), where the die includes a capacitor.

FIG. 2 conceptually illustrates a novel inductor for an integrated device. Specifically, FIG. 2 illustrates a die 200 that is coupled to a printed circuit board (PCB) 202 through a set of solder balls 204. In some implementations, the die 200 is a wafer-level packaging die (e.g., manufactured using a wafer level packaging process). FIG. 2 illustrates a capacitor 203 located in the die 200. Specifically, the capacitor 203 is located in the lower level metal layers of the die 200. More specific examples of a capacitor in the lower level metal layers of a die are further described in FIGS. 18-19. In some implementations, a capacitor is a passive means (e.g., passive capacitive means) configured to store energy (e.g., store energy electrostatically in an electric field).

FIG. 2 also conceptually illustrates an inductor 206 that is defined by components on the die 200, components on the PCB 202, and at least one solder ball 204. In some implementations, the inductor 206 is configured to operate with the capacitor 203 as a filter for an electrical signal. In some implementations, the filter is one of at least a trap filter and/or a notch filter. In some implementations, the filter is a high quality factor (Q) filter.

In some implementations, other materials may be used instead of or in conjunction with the solder ball 204. For example, in some implementations, a metal interconnect (e.g., copper) may be used. As shown in FIG. 2, the die 200 includes a first set of metal layers 210, a via 212, a passivation layer 214, a first polyimide layer 216, a second metal layer 218, a second polyimide layer 220, and a under bump metallization (UBM) layer 222. The first set of metal layers 210 are stacked metal layers in some implementations. In some implementations, a dielectric layers may be positioned between the metal layers in the first set of metal layers 210. The via 212 couples at least one of metal layer from the first set of metal layers 210 to the second metal layer 218. In some implementations, the second metal layer 218 is a post passivation layer. The post passivation layer may be referred as the post passivation interconnect (PPI) layer. The second metal layer 218 may be a copper layer 218 in some implementations. The UBM layer 222 is coupled to the second metal layer 218 (e.g., copper layer). The UBM layer 222 is coupled to a solder 204. In some implementations, a polyimide layer (e.g., first polyimide layer 216) may be an insulative layer.

As further shown in FIG. 2, the PCB 202 includes a first PCB layer 202a (e.g., PCB L1), a second PCB layer 202b (e.g., PCB L2), and a third PCB layer 202c (e.g., PCB L3). One of more of the PCB layers 200a-200c may include one or more traces. As shown in FIG. 2, the first PCB layer 202a includes a trace 224, which is coupled to the solder ball 204.

In some implementations, the inductor 206 may include a winding. The winding of the inductor 206 may be defined by at least one metal layer from the first set of metal layers 210, the via 212, the second metal layer 218, the solder 204 and the trace 224. The winding of the inductor 206 may have several turns (e.g., 2 turns). In some implementations, the inductor 206 leverages one or more traces of the PCB 202 and the solder balls 204 to provide an inductor with better inductance (L), lower resistance and better quality (Q) factor value. More specifically, the inductance generated by the trace and the height of the solder ball, and the magnetic flux between the PCB and metal layers (e.g., metal layer 210, metal layer 218) of the die 200 help increase the inductance of the inductor 206. In one example, inductors that integrate solder balls as part of the inductor are capable of more turns in a given area/space (e.g., area of the die, area of package, area of PCB) than an inductor that does not include solder balls. Inductors with more turns have better inductance (L) than inductors with fewer turns. Consequently, an inductor that includes solder balls, thus is able to be configured to have more turns, will have better inductance (L) than an inductor that does not include solder balls. This and other technical advantages of inductors that include/integrate solder balls will be described below. In addition, the solder balls 204 not only help increase the inductance of the inductor 206, but the solder balls 204 also help provide structure stability for the die 200 and the PCB 202 in some implementations.

Figure 3:
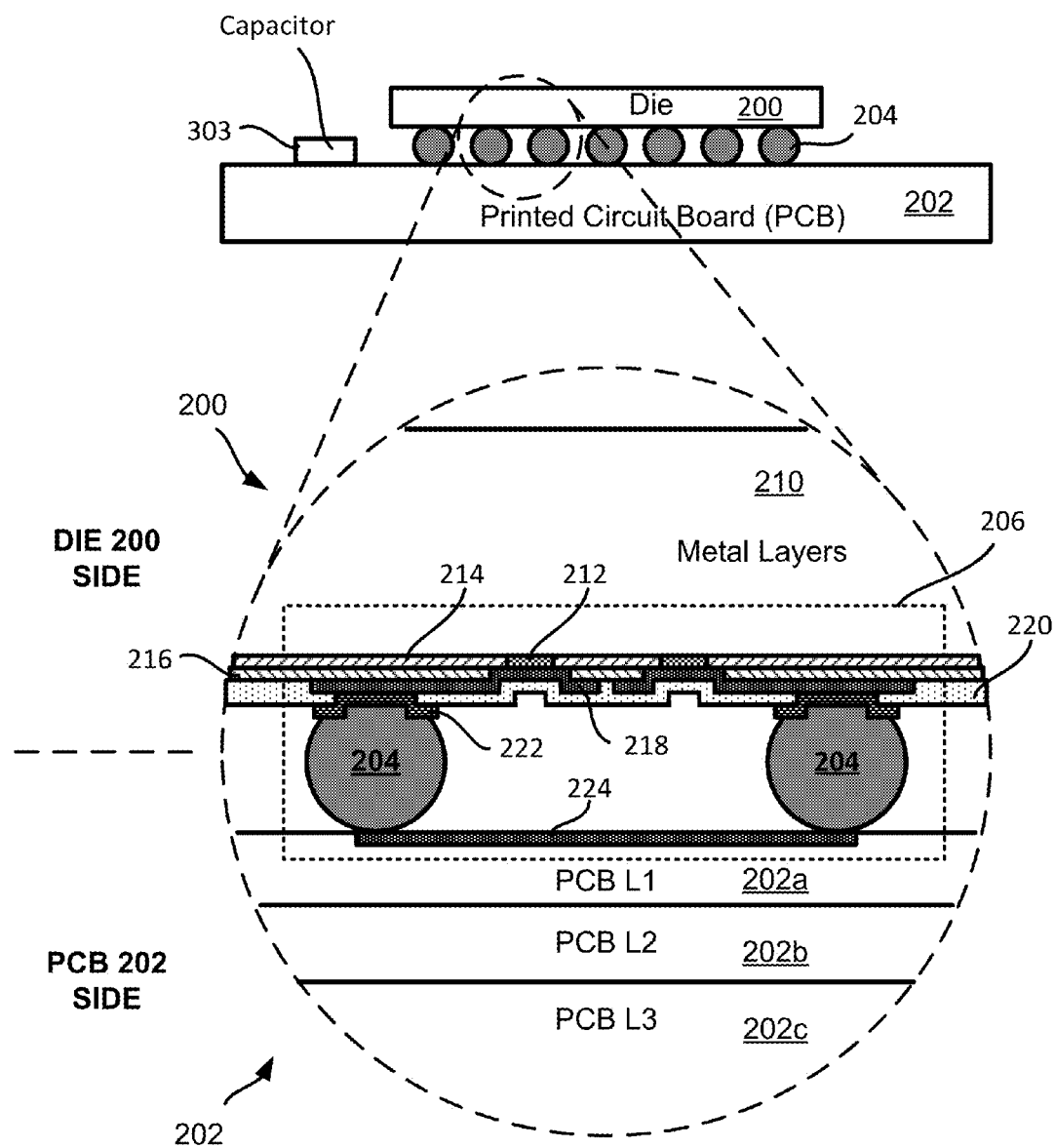
FIG. 3 illustrates an inductor defined between a die and a printed circuit board (PCB), where a capacitor is coupled to the PCB.

FIG. 3 conceptually illustrates another novel inductor for an integrated device. Specifically, FIG. 3 illustrates a die 200 that is coupled to a printed circuit board (PCB) 202 through a set of solder balls 204. In some implementations, the die 200 is a wafer-level packaging die (e.g., manufactured using a wafer level packaging process). FIG. 3 is similar to FIG. 2, except that a capacitor is located in a different location. FIG. 3 illustrates a capacitor 303 that is located on the printed circuit board 202. In some implementations, the capacitor 303 is a surface mounted passive device coupled to pads and/or traces on the printed circuit board (PCB) 202.

It should be noted that in some implementations, the inductor of FIG. 2 may be defined by components of a substrate (e.g., package substrate, interposer) instead of a PCB. That is, in some implementations, an inductor may be defined by components of a die, a substrate, and a solder ball.

FIG. 3 also conceptually illustrates an inductor 206 that is defined by components on the die 200, components on the PCB 202, and at least one solder ball 204. In some implementations, the inductor 206 is configured to operate with the capacitor 303 as a filter for an electrical signal. In some implementations, the filter is one of at least a trap filter and/or a notch filter. In some implementations, the filter is a high quality factor (Q) filter.

It should be noted that in some implementations, the inductor of FIG. 3 may be defined by components of a substrate (e.g., package substrate, interposer) instead of a PCB. That is, in some implementations, an inductor may be defined by components of a die, a substrate, and a solder ball.

Figure 4:
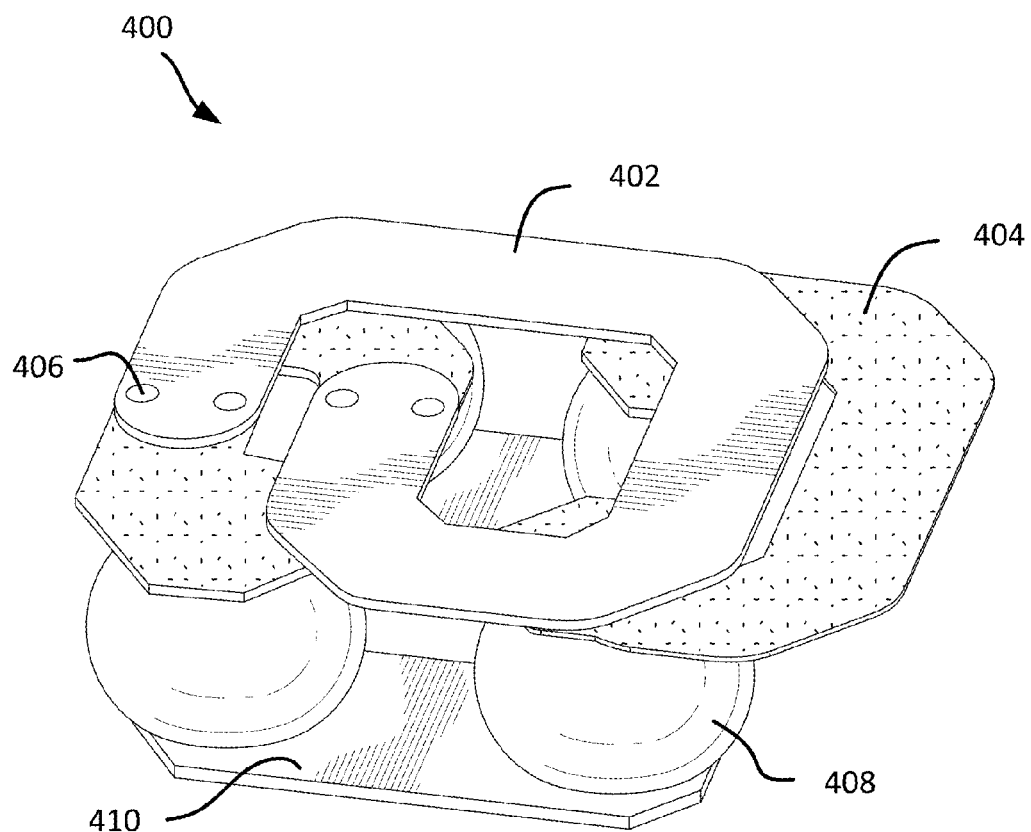
FIG. 4 illustrates a conceptual inductor having 2 turns defined between a die and a printed circuit board (PCB).
Figure 5:
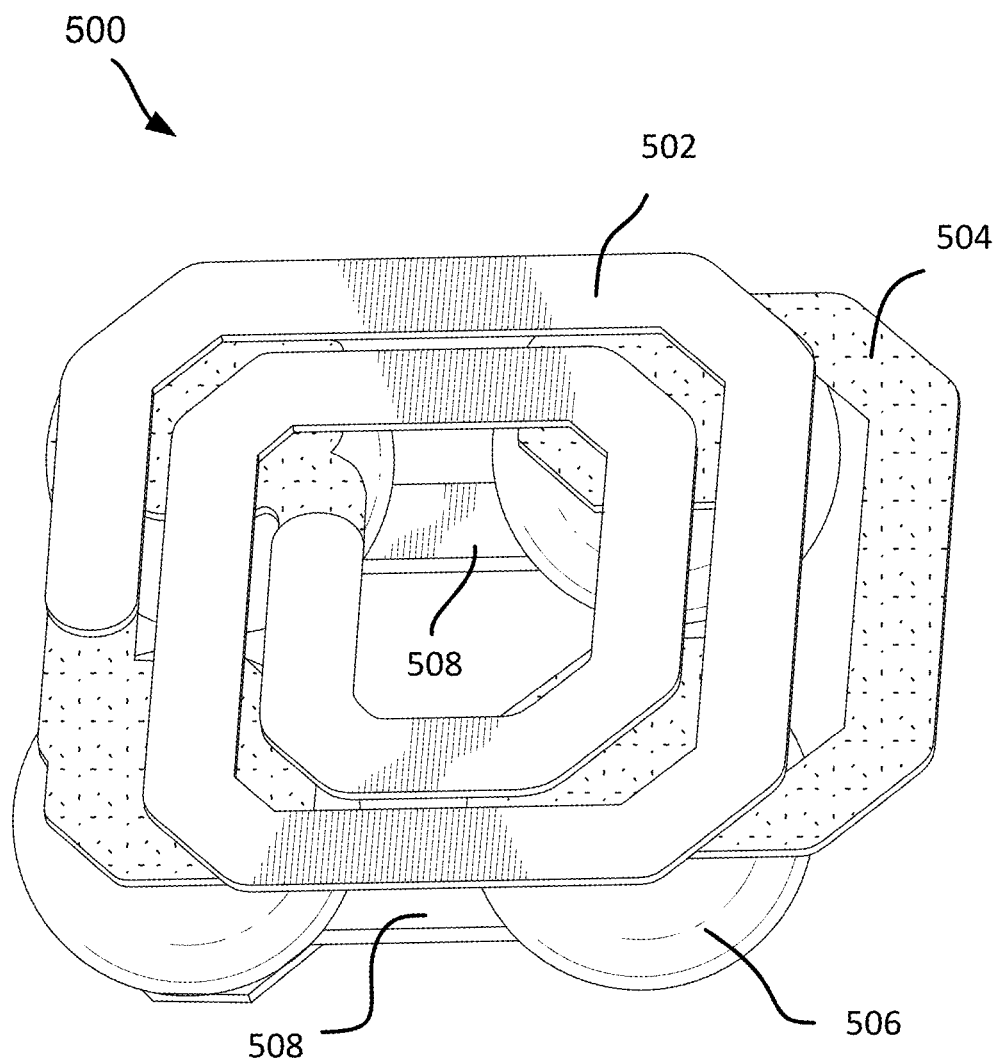
FIG. 5 illustrates a conceptual inductor having 3 turns defined between a die and a printed circuit board (PCB).

FIGS. 4-5 illustrate an inductor that is defined by components from a die, solder balls, and a printed circuit board (PCB) in some implementations. FIG. 4 illustrates an inductor 400 that includes a winding that has 2 turns. In some implementations, the winding of the inductor 400 is defined by a first metal layer 402, a second metal layer 404, a set of vias 406, a set of solder 408, and a set of traces 410. In some implementations, other materials may be used instead of or in conjunction with the solder ball 204. For example, in some implementations, a metal interconnect (e.g., copper) and/or interconnecting metal layer may be used. The first metal layer 402 may be a metal layer from stacked metal layers (e.g., stacked metal layers 210) of a die (e.g., die 200). The second metal layer 404 may be a copper layer (e.g., metal layer 218) of a die. The second metal layer 404 is coupled to the first metal layer 402 through the set of vias 406. The second metal layer 404 is also coupled to the set of solder balls 408. In some implementations, the second metal layer 404 is positioned between the set of solder balls 408 and a passivation layer (not shown) of a die. In some implementations, the die is a wafer-level packaging die (e.g., manufactured using a wafer level packaging process). The set of traces 410 may be one or more trace on a first layer of a printed circuit board (PCB) in some implementations.

FIG. 5 illustrates another inductor 500 that includes a winding. The inductor 500 is similar to the inductor 300 of FIG. 3, except that the inductor 500 has a winding that has 3 turns. In some implementations, the winding of the inductor 500 is defined by a first metal layer 502, a second metal layer 504, a set of vias (not visible), a set of solder 506, and a set of traces 508. The first metal layer 502 may be a metal layer from stacked metal layers (e.g., stacked metal layers 210) of a die (e.g., die 200). The second metal layer 504 may be a copper layer (e.g., metal layer 218) of a die. The second metal layer 504 is coupled to the first metal layer 502 through the set of vias (not visible). The second metal layer 504 is also coupled to the set of solder balls 506. In some implementations, the second metal layer 504 is positioned between the set of solder balls 506 and a passivation layer (not shown) of a die. In some implementations, the die is a wafer-level packaging die (e.g., manufactured using a wafer level packaging process). The set of traces 508 may be one or more trace on a first layer of a printed circuit board (PCB) in some implementations.

The above exemplary inductors that include/integrate solder balls as part of the inductor provide several technical advantages over known inductors (e.g., inductors that do not integrate solder balls). For example, the above exemplary inductors provide better performance/properties than known inductors. Some of the relevant properties of an inductor include effective inductance, Q factor and/or effectiveness of the coupling of the inductor. The effectiveness of an inductor may be defined by its Q factor. A Q factor is a quality factor/value that defines the efficiency of an inductor. A Q factor of an inductor may be defined as the ratio between the inductance of the inductor and the resistance of the inductor (e.g., $Q=L/R$). The higher the Q factor, the closer the inductor approaches the behavior of an ideal inductor, which is a lossless inductor. Thus, generally speaking, a higher Q factor is more desirable than a lower Q factor. In some implementations, the above exemplary inductors have better inductance (L) (e.g., higher inductance), better Q factor (e.g., higher Q factor) and better resistance (R) (e.g., lower resistance).

In some implementations, these better properties may be achieved by maximizing magnetic flux by increasing the number of turns/windings of the inductor in a given area (e.g., area of the die, area of package, area of PCB) and thus increasing the coupling between layers. As described above, integrating solder balls as part of an inductor allows for more turns in the inductor in a given area/space (e.g., area of the die, area of package, area of PCB). Thus, integrating solder balls in an inductor increases the inductance (L), which increases the Q factor of the inductor.

Another reason these inductors have better properties (e.g., better inductance) is that they leverage the height of the solder balls to increase inductance. One benefit of using an inductor that integrates solder balls is that such inductors are capable of supporting high current for high power applications. Moreover, the relatively large size of solder balls (compared to metal layers of the die that are part of the inductor) lowers the resistance of the inductor, which effectively increases the Q factor of the inductor. On a similar note, traces on a PCB that are part of an inductor are typically larger than metal layers in a die that are part of the inductor. In some implementations, these traces (that area part of the inductor) of PCB may be about 2 times wider than the metal interconnects/lines (that area part of the inductor) on the die. These wider traces have lower resistance than the narrower metal interconnects. Consequently, these wider traces lower the overall effective resistance of the inductor. As result, an inductor that integrate traces on the PCB as part of the inductor has a better Q factor (because of the lower resistance) than an inductor that is solely in a die.

Moreover, using and keeping the solder balls helps provides/maintain the structural coupling, stability, and/or rigidity of the semiconductor device, while at the same time minimizing, avoiding degradation of the magnetic flux due to solder ball effects. For example, keeping the solder balls helps reduce mechanical stress in the semiconductor device (e.g., package).

It should be noted that in some implementations, the inductor of FIGS. 4-5 may be defined by components of a substrate (e.g., package substrate, interposer) instead of a PCB. That is, in some implementations, an inductor may be defined by components of a die, a substrate, and a solder ball.

Figure 6:
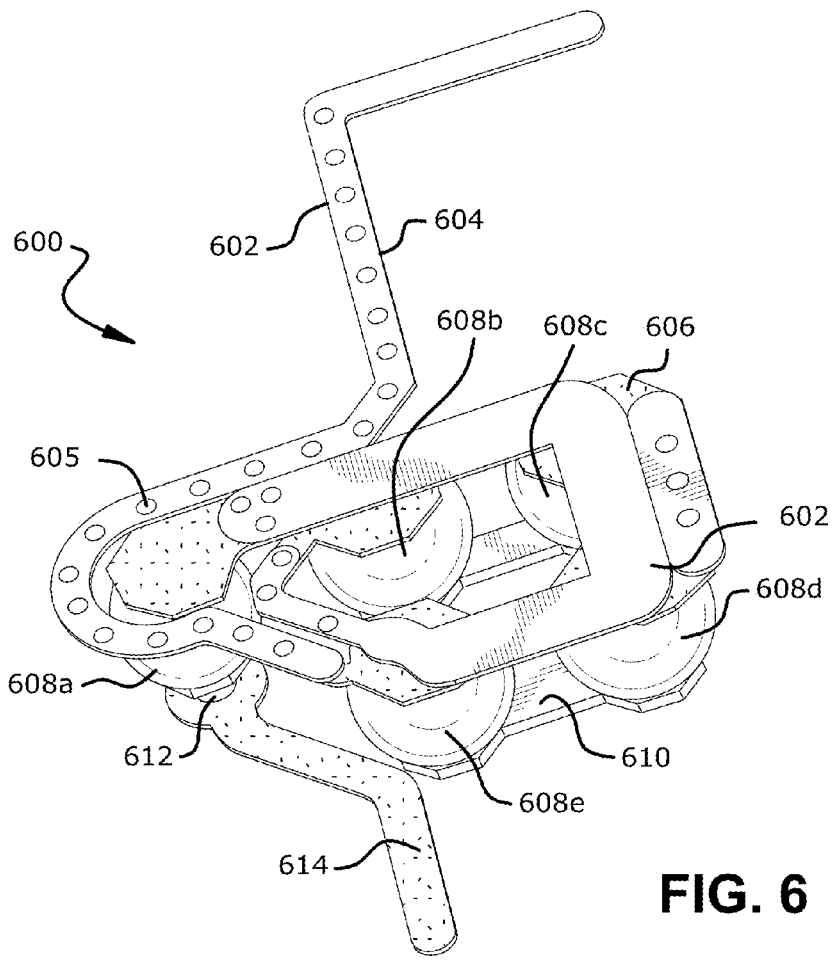
FIG. 6 illustrates an angled view of an inductor defined between a die and a printed circuit board (PCB).

FIGS. 6-9 illustrate another example of a novel inductor in some implementations. FIG. 6 illustrates an inductor 600 from an angled point of view. As shown in FIG. 6, the inductor 600 includes a first metal layer 602, a second metal layer 604, a set of vias 605, a third metal layer 606, a set of solder balls 608 (e.g., first solder ball 608a, second solder ball 608b, third solder ball 608c, fourth solder ball 608d, fifth solder ball 608e), a fourth metal layer 610, a via 612 and a fifth metal layer 614.

In some implementations, the first metal layer 602, the second metal layer 604 and the third metal 606 are metal layers of a die. For example, the first, second and third metal layers 602-606 may be one of the metal layers of the die 200 of FIG. 2. In particular, the first and second metal layers 602-604 may correspond to the metal layers 210 of FIG. 2 and the third metal layer 606 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 605 may be vias in a die in some implementations. For example, one of the vias from the set of vias 605 may correspond to the via 212 of FIG. 2. In some implementations, the set of vias 605 is positioned and configured to reduce the resistance of the inductance, thereby increasing the Q factor of the inductor.

The set of solder balls 608 provides an interconnect path/interconnect means between a die and a printed circuit board (PCB). However, other materials may be used to provide an interconnect path/interconnect means between a die and a PCB.

In some implementations, the fourth metal layer 610, the via 612 and the fifth metal layer 614 are located in a printed circuit board (PCB). For example, the fourth metal layer 610 and the fifth metal layer 614 may be metal layers of a PCB. In one example, the fourth metal layer may be the metal layer 224 of the PCB 202 of FIG. 2 in some implementations.

Figure 7:
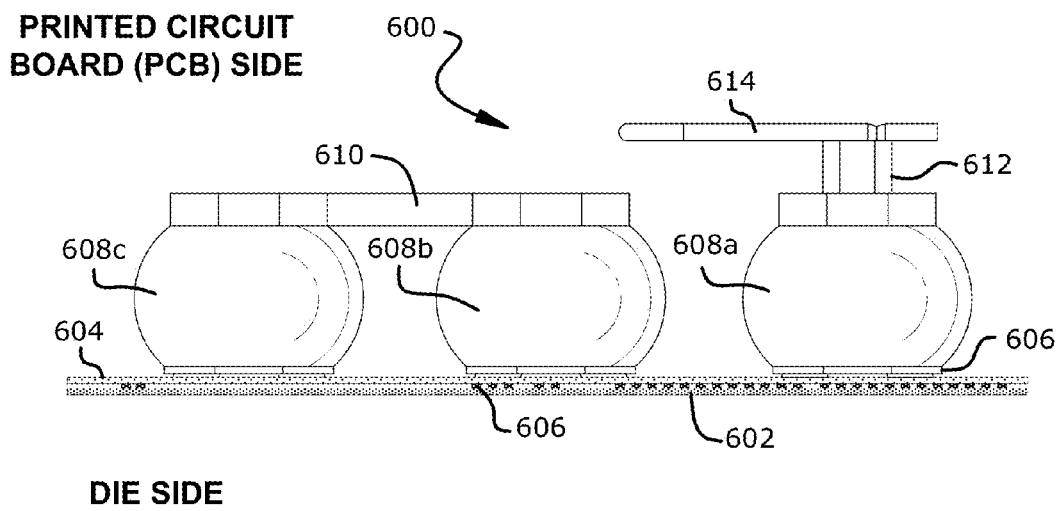
FIG. 7 illustrates a side view of an inductor defined between a die and a printed circuit board (PCB).

FIG. 7 illustrates a side view of the inductor 600 of FIG. 6. Specifically, FIG. 7 illustrates a side view of an inductor defined by metal layers of a die, solder balls and metal layers of a printed circuit board. As shown in FIG. 7, the inductor 600 includes the first metal layer 602, the second metal layer 604, the set of vias 605, the third metal layer 606, the set of solder balls 608 (e.g., first solder ball 608a, second solder ball 608b, third solder ball 608c), the fourth metal layer 610, a via 612 and a fifth metal layer 614.

In some implementations, the first metal layer 602, the second metal layer 604 and the third metal 606 are metal layers of a die. For example, the first, second and third metal layers 602-606 may be one of the metal layers of the die 200 of FIG. 2. In particular, the first and second metal layers 602-604 may correspond to the metal layers 210 of FIG. 2 and the third metal layer 606 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 605 may be vias in a die in some implementations. For example, one of the vias from the set of vias 605 may correspond to the via 212 of FIG. 2. The set of solder balls 608 provides an interconnect path/interconnect means between a die and a printed circuit board (PCB). However, other materials may be used to provide an interconnect path/interconnect means between a die and a PCB.

In some implementations, the fourth metal layer 610, the via 612 and the fifth metal layer 614 are located in a printed circuit board (PCB). For example, the fourth metal layer 610 and the fifth metal layer 614 may be metal layers of a PCB. In one example, the fourth metal layer may be the metal layer 224 of the PCB 202 of FIG. 2 in some implementations.

Figure 8:
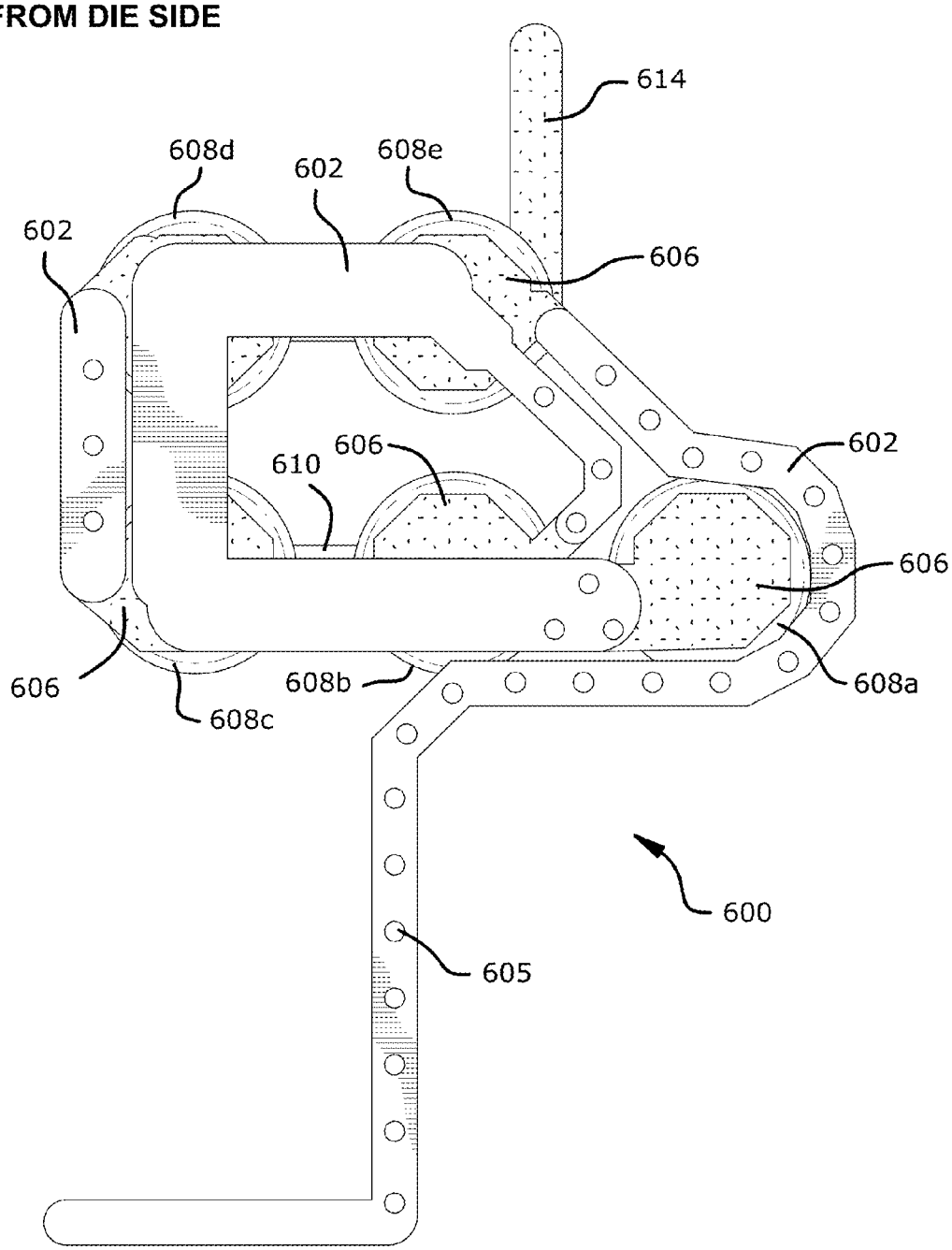
FIG. 8 illustrates a bottom view of an inductor defined between a die and a printed circuit board (PCB).

FIG. 8 illustrates a view (e.g., bottom view) of the inductor 600 of FIG. 6 from the perspective of the die. Specifically, FIG. 8 illustrates a bottom view of an inductor defined by metal layers of a die, solder balls and metal layers of a printed circuit board. It should be noted that the view of FIG. 8 may be a top view depending on how the inductor, die, and/or PCB are positioned. As shown in FIG. 8, the inductor 600 includes the first metal layer 602, the second metal layer 604, the set of vias 605, the third metal layer 606, the set of solder balls 608 (e.g., first solder ball 608a, second solder ball 608b, third solder ball 608c), the fourth metal layer 610, a via 612 and a fifth metal layer 614.

In some implementations, the first metal layer 602, the second metal layer 604 and the third metal 606 are metal layers of a die. For example, the first, second and third metal layers 602-606 may be one of the metal layers of the die 200 of FIG. 2. In particular, the first and second metal layers 602-604 may correspond to the metal layers 210 of FIG. 2 and the third metal layer 606 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 605 may be vias in a die in some implementations. For example, one of the vias from the set of vias 605 may correspond to the via 212 of FIG. 2. The set of solder balls 608 provides an interconnect path/interconnect means between a die and a printed circuit board (PCB). However, other materials may be used to provide an interconnect path/interconnect means between a die and a PCB.

In some implementations, the fourth metal layer 610, the via 612 and the fifth metal layer 614 are located in a printed circuit board (PCB). For example, the fourth metal layer 610 and the fifth metal layer 614 may be metal layers of a PCB. In one example, the fourth metal layer may be the metal layer 224 of the PCB 202 of FIG. 2 in some implementations.

Figure 9:
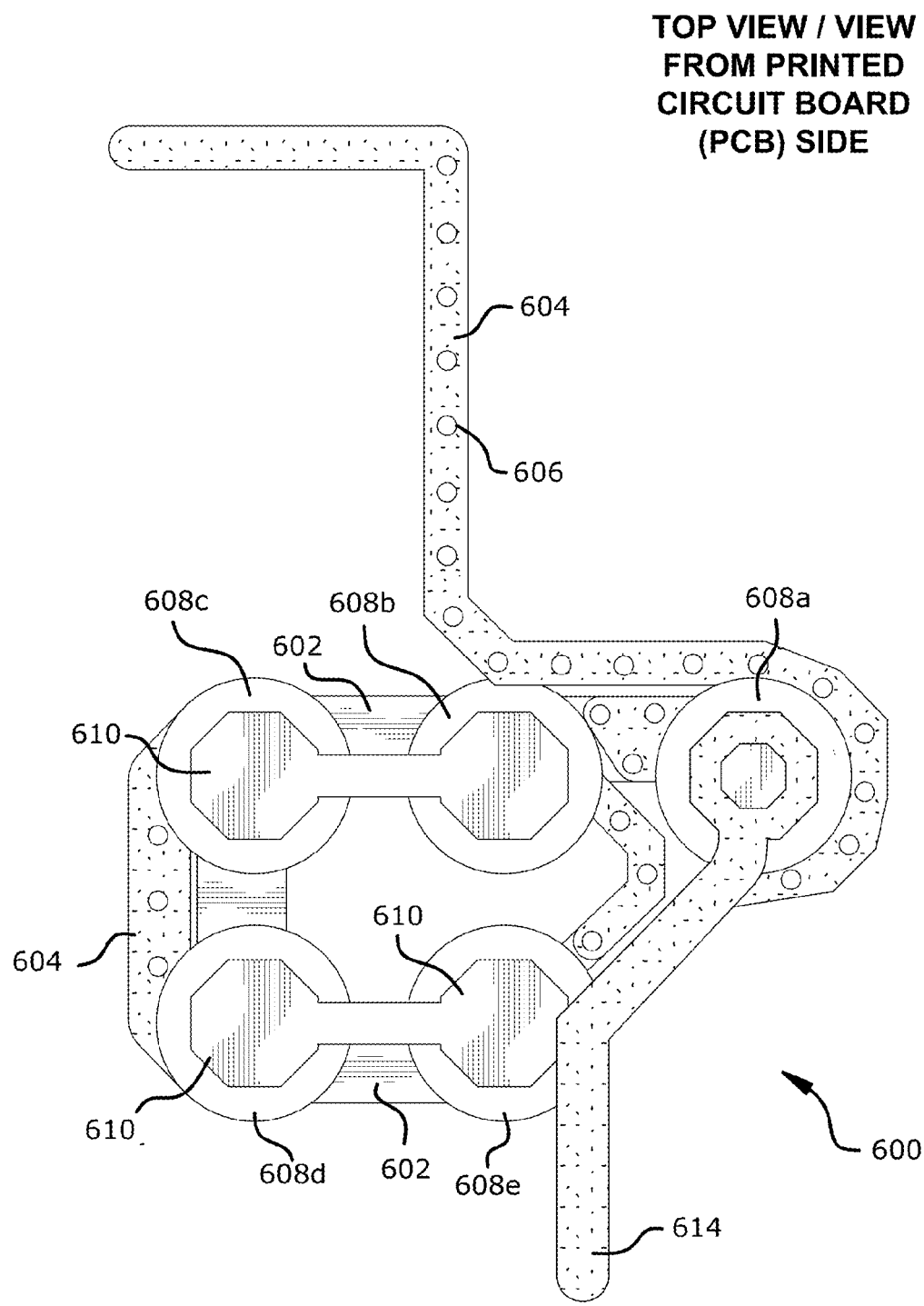
FIG. 9 illustrates a top view of an inductor defined between a die and a printed circuit board (PCB).

FIG. 9 illustrates a view (e.g., top view) of the inductor 600 of FIG. 6 from the perspective of the printed circuit board (PCB). Specifically, FIG. 9 illustrates a top view of an inductor defined by metal layers of a die, solder balls and metal layers of a printed circuit board. It should be noted that the view of FIG. 9 may be a bottom view depending on how the inductor, die, and/or PCB are positioned. As shown in FIG. 9, the inductor 600 includes the first metal layer 602, the second metal layer 604, the set of vias 605, the third metal layer 606, the set of solder balls 608 (e.g., first solder ball 608a, second solder ball 608b, third solder ball 608c), the fourth metal layer 610, a via 612 and a fifth metal layer 614.

In some implementations, the first metal layer 602, the second metal layer 604 and the third metal 606 are metal layers of a die. For example, the first, second and third metal layers 602-606 may be one of the metal layers of the die 200 of FIG. 2. In particular, the first and second metal layers 602-604 may correspond to the metal layers 210 of FIG. 2 and the third metal layer 606 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 605 may be vias in a die in some implementations. For example, one of the vias from the set of vias 605 may correspond to the via 212 of FIG. 2. The set of solder balls 608 provides an interconnect path/interconnect means between a die and a printed circuit board (PCB). However, other materials may be used to provide an interconnect path/interconnect means between a die and a PCB.

In some implementations, the fourth metal layer 610, the via 612 and the fifth metal layer 614 are located in a printed circuit board (PCB). For example, the fourth metal layer 610 and the fifth metal layer 614 may be metal layers of a PCB. In one example, the fourth metal layer may be the metal layer 224 of the PCB 202 of FIG. 2 in some implementations.

FIGS. 2-9 illustrate examples of an inductor defined by components on a die, printed circuit board (PCB) and a solder ball. As shown in FIGS. 2-9, these inductors bypass the use of a packaging substrate. In other words, these inductors are free of a packaging substrate. The advantage of bypassing the use of a packaging substrate is lower cost (because of using less material) and smaller size. In some implementations, an inductor may also be defined by components on a first die, a second die, and a solder ball. These other types of inductors will be further described below. However, in some implementations, the inductor may be defined by components of a substrate (e.g., package substrate, interposer) instead of a PCB. That is, in some implementations, an inductor may be defined by components of a die, a substrate, and a solder ball.

Figure 10:
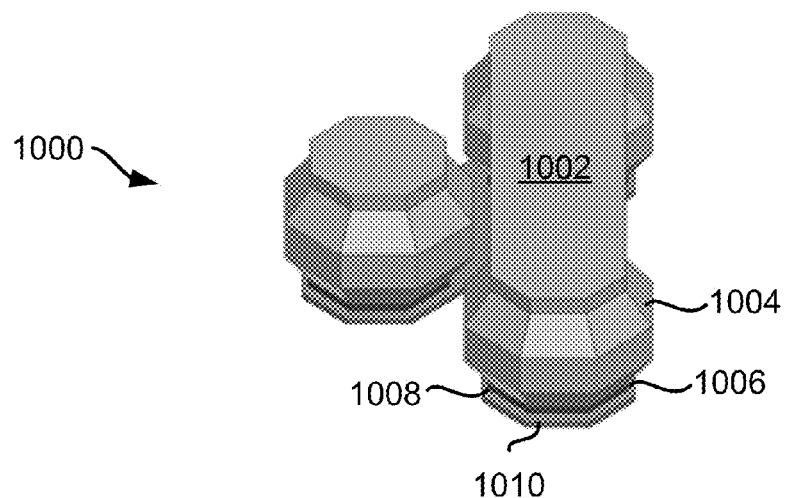
FIG. 10 illustrates an angled view of an inductor defined between a die and a printed circuit board (PCB).
Figure 11:
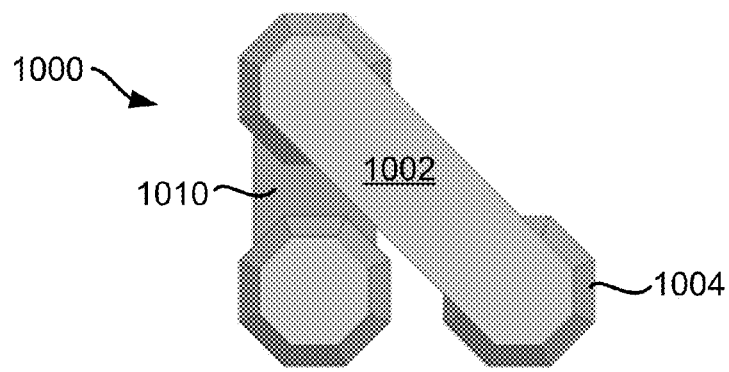
FIG. 11 illustrates a plan view of an inductor defined between a die and a printed circuit board (PCB).
Figure 12:
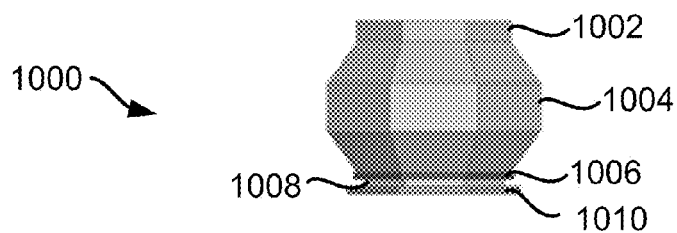
FIG. 12 illustrates a profile view of an inductor defined between a die and a printed circuit board (PCB).

FIGS. 10-12 illustrate another novel inductor in some implementations. FIG. 10 illustrates an angled view of an inductor 1000 formed by traces in a printed circuit board (PCB), at least one solder ball, and metal layers in an integrated device. Specifically, FIG. 10 illustrates the inductor 1000 that includes a first interconnect 1002, a solder ball 1004, an under bump metallization (UBM) layer 1006, and a first redistribution layer 1010. In some implementations, the first interconnect 1002 is a trace in/on a printed circuit board (PCB). In some implementations, the first interconnect 1002 is an interconnect on a substrate (e.g., package substrate, interposer). FIG. 10 illustrates an dielectric layer 1006 between the UBM layer 1006 and the first redistribution layer 1010. FIG. 11 illustrates a plan view of the inductor 1000 of FIG. 10. FIG. 12 illustrates a profile view of the inductor 1000 of FIG. 10.

It should be noted that in some implementations, the inductor of FIGS. 10-12 may be defined by components of a substrate (e.g., package substrate, interposer) instead of a PCB. That is, in some implementations, an inductor may be defined by components of a die, a substrate, and a solder ball.

Having described various novel inductors (e.g., inductor defined by two dies, inductor defined by two package substrates), methods for fabricating/providing such inductors will now be described below.

Exemplary Method for Fabricating/Providing Inductor and Capacitor

Figure 13:
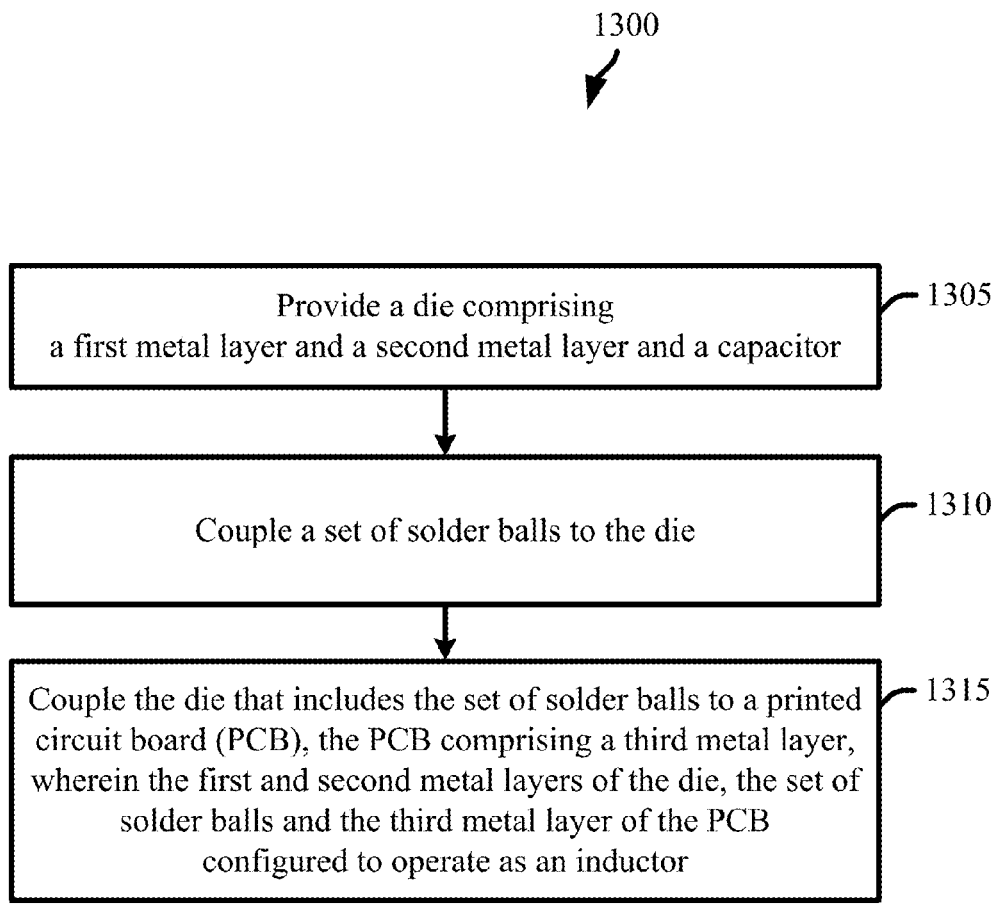
FIG. 13 illustrates a flow diagram for manufacturing/providing an inductor.

FIG. 13 illustrates a flow diagram of a method for fabricating/providing an inductor and/or capacitor. In some implementations, the method of FIG. 13 may be implemented to manufacture/provide the inductors described in FIGS. 2-12.

As shown in FIG. 13, the method provides (at 1305) a die that includes a first metal layer, a second metal layer and a capacitor. The second metal may be a post passivation layer. The die may include a passivation layer. The passivation layer may be a dielectric material and may be located between the first metal layer and the second metal layer (e.g., post passivation layer) of the die. The die may also include an under bump metallization layer (UBM) layer, which is coupled to the second metal layer of the die. In some implementations, the die is manufactured using wafer level packaging. The capacitor may be located in the lower level metal layers of the die. An example of a die with a capacitor is further described in FIGS. 18-19. The method couples (at 1310) a set of solder balls to the die. In some implementations, coupling the set of solder balls to the die includes coupling a solder ball to a UBM layer of the die. FIG. 2 illustrates an example of a solder ball coupled to a UBM layer of a die. Specifically, FIG. 2 illustrates solder ball 204 coupled to UBM 222 of die 200.

The method further couples (at 1315) the die that includes the set of solder balls to a printed circuit board (PCB). The PCB includes a third metal layer. In some implementations, the PCB may include additional metal layers (e.g., fourth metal layer, fifth metal layer). Once the die is coupled to the PCB, the first and second metal layers of the die, the set of solder balls and the third metal layer of the PCB are configured to operate as an inductor. In some implementations, the additional metal layers of the PCB (e.g., fourth metal layer, fifth metal layer) along with the first and second metal layers of the die, the set of solder balls and the third metal layer of the PCB may be configured to operate as an inductor. In some implementations, the combination of the inductor and capacitor provides an electrical signal filter with a high Q value. In some implementations, the filter is one of at least a trap filter and/or a notch filter.

Another advantage of the inductor described in the disclosure is that it does not required special additional manufacturing processes.

Exemplary Integrated Device Comprising Inductors and Capacitor

Figure 14:
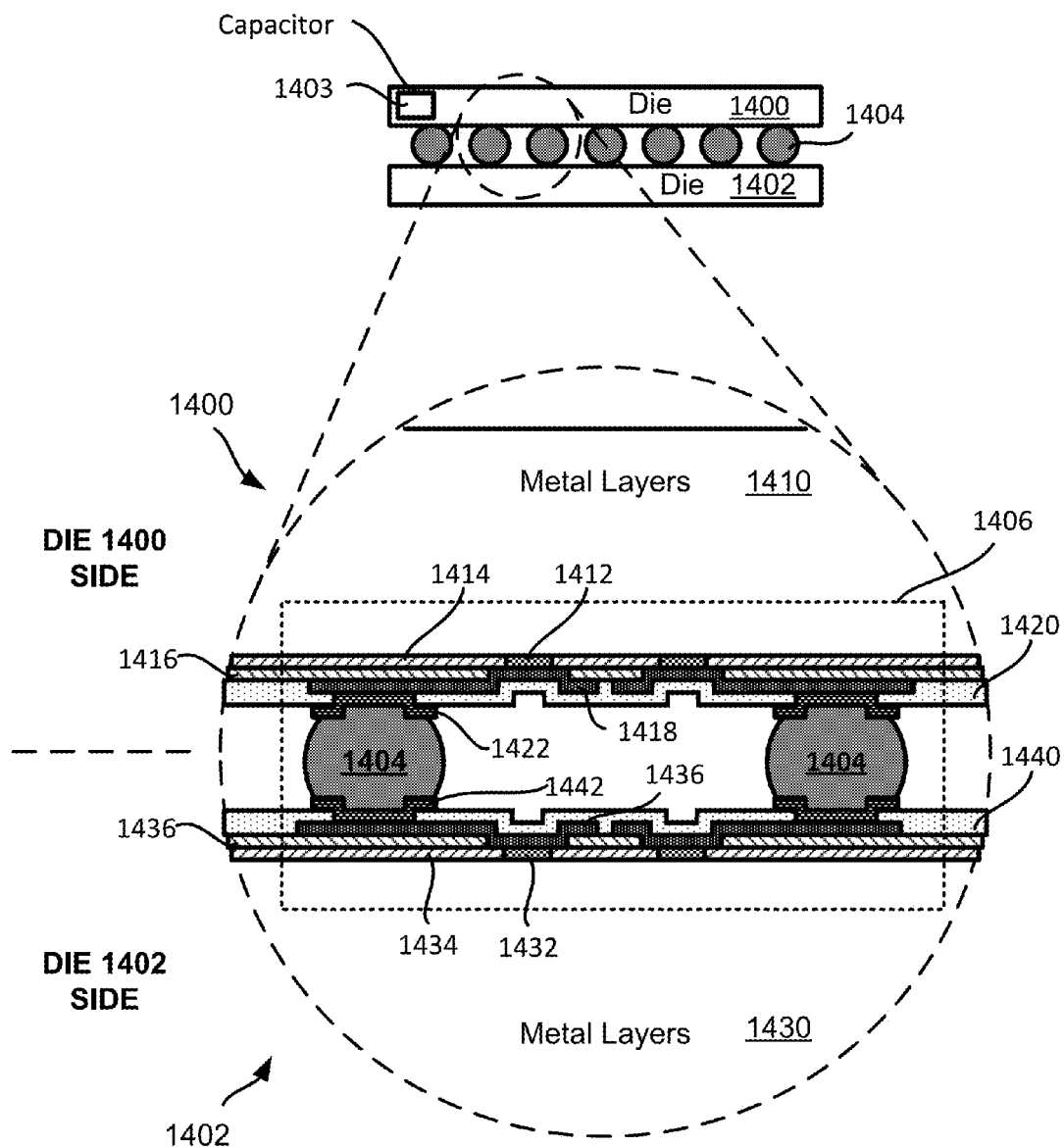
FIG. 14 illustrates an inductor defined between a first die and a second die.
Figure 15:
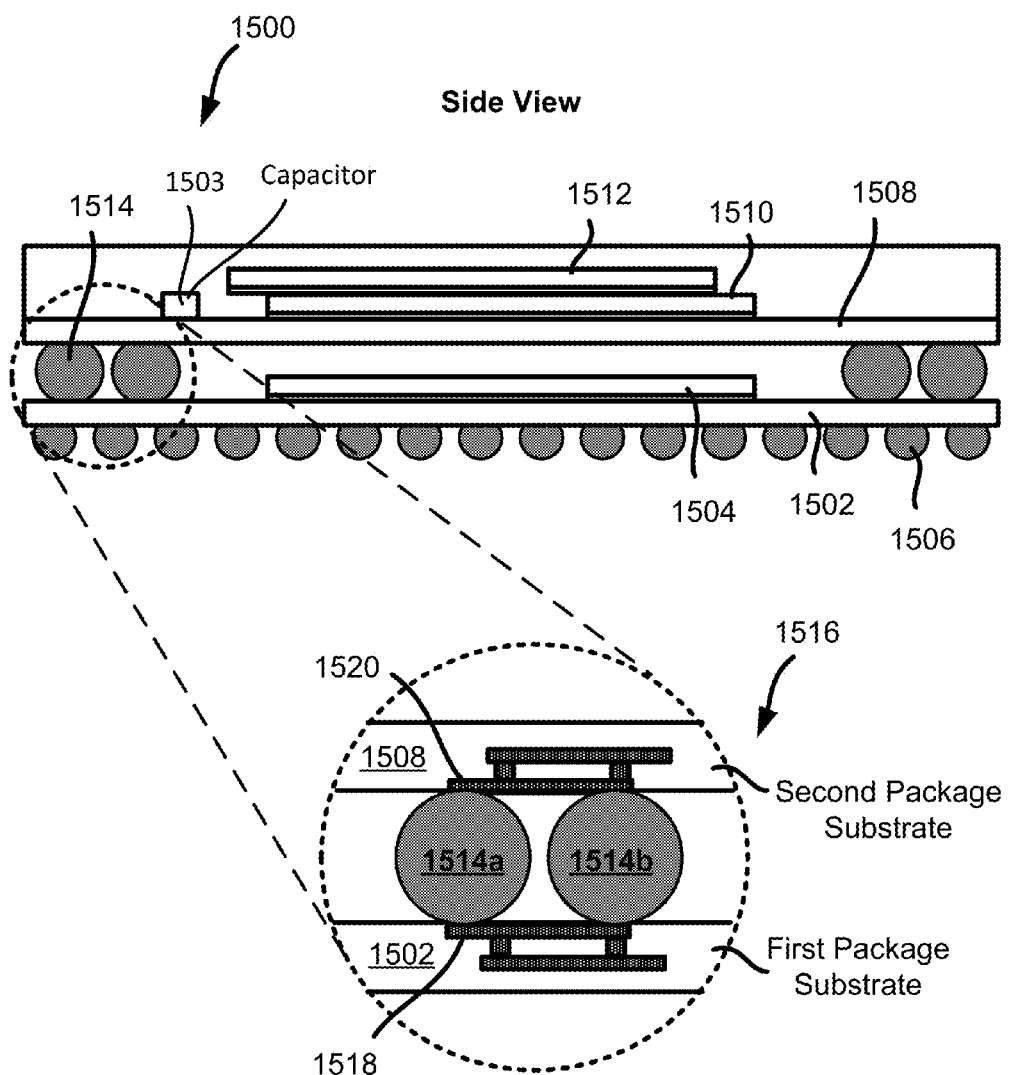
FIG. 15 illustrates an inductor in a package on package structure.

FIGS. 2-12 illustrate some examples of novel inductors and capacitors. However, some implementations may also use different designs and configurations. FIGS. 14-15 illustrate other examples of novel inductors and capacitors.

FIG. 14 conceptually illustrates a novel inductor for an integrated device that includes a capacitor. Specifically, FIG. 14 illustrates a first die 1400 that is coupled to a second die 1402 through a set of solder balls 1404. In some implementations, the first die and/or second die are wafer-level packaging dies (e.g., manufactured using a wafer level packaging process). FIG. 14 illustrates a capacitor 1403 located in the first die 1400. Specifically, the capacitor 1403 is located in the lower level metal layers of the die 1400. More specific examples of a capacitor in the lower level metal layers of a die are further described in FIGS. 18-19. In some implementations, a capacitor is a passive means (e.g., passive capacitive means) configured to store energy (e.g., store energy electrostatically in an electric field).

FIG. 14 also conceptually illustrates an inductor 1406 that is defined by components on the first die 1400, components on the second die 1402, and at least one solder ball 1404. In some implementations, the inductor 1406 is configured to operate with the capacitor 1403 as a filter for an electrical signal. In some implementations, the filter is one of at least a trap filter and/or a notch filter. In some implementations, the filter is a high quality factor (Q) filter.

As shown in FIG. 14, the first die 1400 includes a first set of metal layers 1410, a via 1412, a passivation layer 1414, a first polyimide layer 1416, a second metal layer 1418, a second polyimide layer 1420, and a under bump metallization (UBM) layer 1422. The first set of metal layers 1410 are stacked metal layers in some implementations. In some implementations, a dielectric layers may be positioned between the metal layers in the first set of metal layers 210. The via 1412 couples at least one of metal layer from the first set of metal layers 1410 to the second metal layer 1418. In some implementations, the second metal layer 1418 is a post passivation layer. The post passivation layer may be referred as the post passivation interconnect (PPI) layer. The second metal layer 1418 may be a copper layer 1418 in some implementations. The UBM layer 1422 is coupled to the second metal layer 1418 (e.g., copper layer). The UBM layer 1422 is coupled to a solder 1404.

As further shown in FIG. 14, the second die 1430 includes a first set of metal layers 1430, a via 1432, a passivation layer 1434, a first polyimide layer 1436, a second metal layer 1438, a second polyimide layer 1440, and an under bump metallization (UBM) layer 1442. The first set of metal layers 1430 are stacked metal layers in some implementations. The via 1432 couples at least one of metal layer from the first set of metal layers 1430 to the second metal layer 1438. The second metal layer 1438 may be a copper layer 1438 in some implementations. The UBM layer 1442 is coupled to the second metal layer 1438 (e.g., copper layer). The UBM layer 1442 is coupled to a solder 1404.

In some implementations, the inductor 1406 may include a winding. The winding of the inductor 1406 may be defined by at least one metal layer from the first set of metal layers 1410, the via 1412, the second metal layer 1418, the solder 1404, the second metal layer 1438, the via 1432, and at least one metal layer from the first set of metal layers 1430. The winding of the inductor 1406 may have several turns (e.g., 2 turns).

In some implementations, a die may be in a die package (which includes a packaging substrate). A die package may be referred to as a wafer level package. Accordingly, in some implementations, an inductor may be defined by components of a first die package, a second die package, and a set of solder balls.

Another example of a novel inductor and a capacitor is shown in FIG. 15. Specifically, FIG. 15 illustrates an inductor defined in a package on package (PoP) structure that includes a capacitor. As illustrated in FIG. 15, the PoP structure 1500 includes a first package substrate 1502, a capacitor 1503, a first die 1504, a first set of solder balls 1506, a second package substrate 1508, a second die 1510, a third die 1512, a second set of solder balls 1514. In some implementations, the first die 1504 may be a logic die. The second and third dies 1510-1512 may be stacked memory dies in some implementations.

In some implementations, the first package of the PoP structure 1500 may includes the first package substrate 1502, the capacitor 1503, the first die 1504, and the first set of solder balls 1506. The first die 1504 may be an Application Specific Integrated Circuit (ASIC) die in some implementations. In some implementations, the second package of the PoP structure 1500 may includes the second package substrate 1508, the second die 1510, the third die 1512, and the second set of solder balls 1514. In some implementations, the capacitor 1503 is a surface mounted passive device that is coupled to the first package substrate 1502. In some implementations, a capacitor is a passive means (e.g., passive capacitive means) configured to store energy (e.g., store energy electrostatically in an electric field).

In some implementations, an inductor 1516 in the PoP structure 1500 may be defined by the second set of solder balls 1514 (e.g., solder ball 1514a, solder ball 1514b) and at least one metal layer in the first and second package substrate 1502 and 1508. Specifically, the metal layer 1518 of the first package substrate 1502, the solder ball 1514a, the solder ball 1514b, and the metal layer 1520 of the second package substrate 1508 are configured to operate as the inductor 1516 in the PoP structure 1500 in some implementations. In some implementations, the first package substrate 1502 may include additional metal layers. Similarly, the second package substrate 1508 may include additional metal layers. In some implementations, one or more additional metal layers of the first package substrate 1502 and/or second package substrate 1508 may be part of the inductor 1516. That is, in some implementations, one or more additional metal layers of the first package substrate 1502 and/or second package substrate 1508 may be configured to operate as the inductor 1516. For example, first and second metal layers of the first package substrate 1502, second and third metal layers of the second package substrate 1508, and the solder balls 1514a-b may be configured to operate as an inductor in some implementations. In FIG. 15, solder balls 1514a-b are integrated in the inductor 1516. However, in some implementations, other interconnecting means may be used in lieu of or in conjunction with the solder balls.

In some implementations, the inductor 1516 is configured to operate with the capacitor 1503 as a filter for an electrical signal. In some implementations, the filter is one of at least a trap filter and/or a notch filter. In some implementations, the filter is a high quality factor (Q) filter.

Having described various novel inductors (e.g., inductor defined by two dies, inductor defined by two package substrates), methods for manufacturing/providing such inductors will now be described below.

Exemplary Methods for Manufacturing/Providing Inductor and a Capacitor

Figure 16:
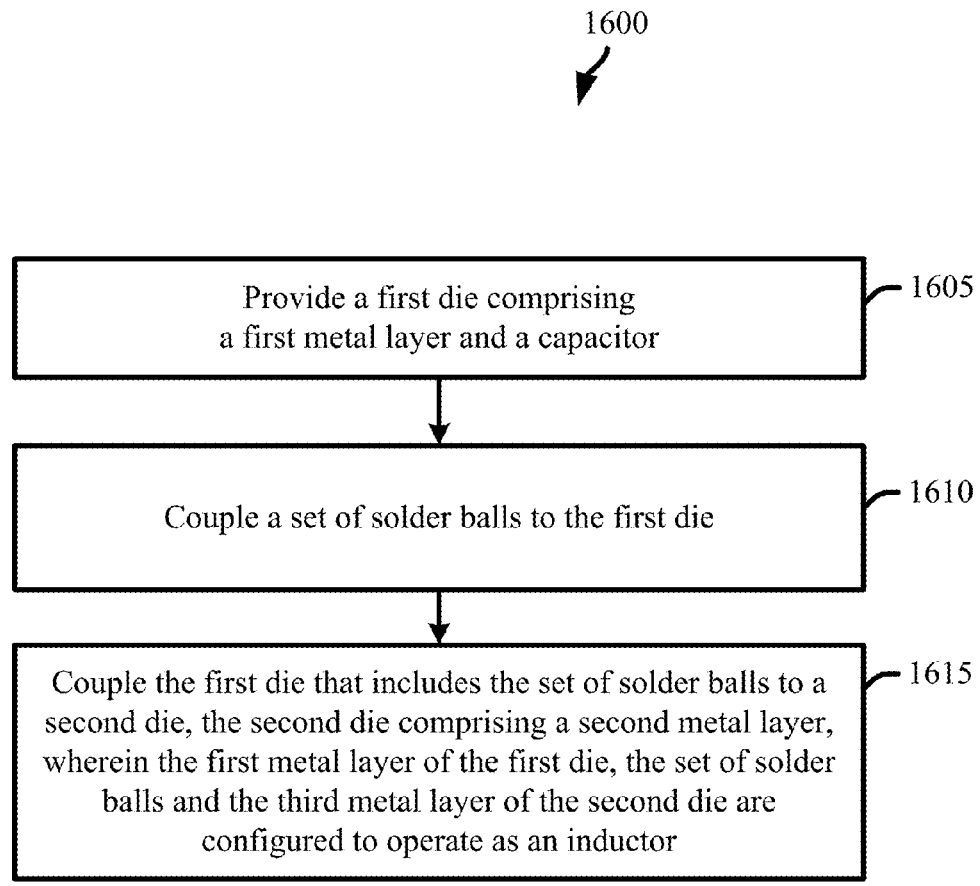
FIG. 16 illustrates a flow diagram for manufacturing/providing an inductor.

FIG. 16 illustrates a flow diagram of a method for fabricating/providing an inductor defined by two dies and a set of solder balls. In some implementations, the method of FIG. 16 may be implemented to manufacture/provide the inductor described in FIG. 14.

As shown in FIG. 16, the method provides (at 1605) a first die that includes a first metal layer and a capacitor. In some implementations, the capacitor is located in lower level metal layers of the first die. Examples of capacitors in lower level metal layers of a die are further described in FIGS. 18-19. In some implementations, the first die is manufactured using wafer level packaging. In some implementations, the first die may include additional metal layers (e.g., third metal layer). Moreover, in some implementations, one of the metal layers of the first die (e.g., first metal layer) may be a post passivation layer. The first die may include a passivation layer. The passivation layer may be a dielectric material and may be located between the first metal layer and another metal layer of the first die. The first die may also include an under bump metallization layer (UBM) layer, which is coupled to the first metal layer of the die. The method couples (at 1610) a set of solder balls to the first die. In some implementations, coupling the set of solder balls to the first die includes coupling a solder ball to a UBM layer of the first die. FIG. 14 illustrates an example of a solder ball coupled to a UBM layer of a die. Specifically, FIG. 14 illustrates solder ball 1404 coupled to UBM 1422 of die 1400.

The method further couples (at 1615) the first die that includes the set of solder balls to a second die. In some implementations, the second die is manufactured using wafer level packaging. The second die includes a second metal layer. In some implementations, the second die may include additional metal layers (e.g., fourth metal layer, fifth metal layer). Once the first die is coupled to the second die, the first metal layer of the first die, the set of solder balls and the second metal layer of the second die are configured to operate as an inductor. In some implementations, the additional metal layers of the second die (e.g., fourth metal layer, fifth metal layer) along with the first and third metal layers of the first die, the set of solder balls and the second metal layer of the second die may be configured to operate as an inductor.

In some implementations, the inductor is configured to operate with the capacitor as a filter for an electrical signal. In some implementations, the filter is one of at least a trap filter and/or a notch filter. In some implementations, the filter is a high quality factor (Q) filter.

Figure 17:
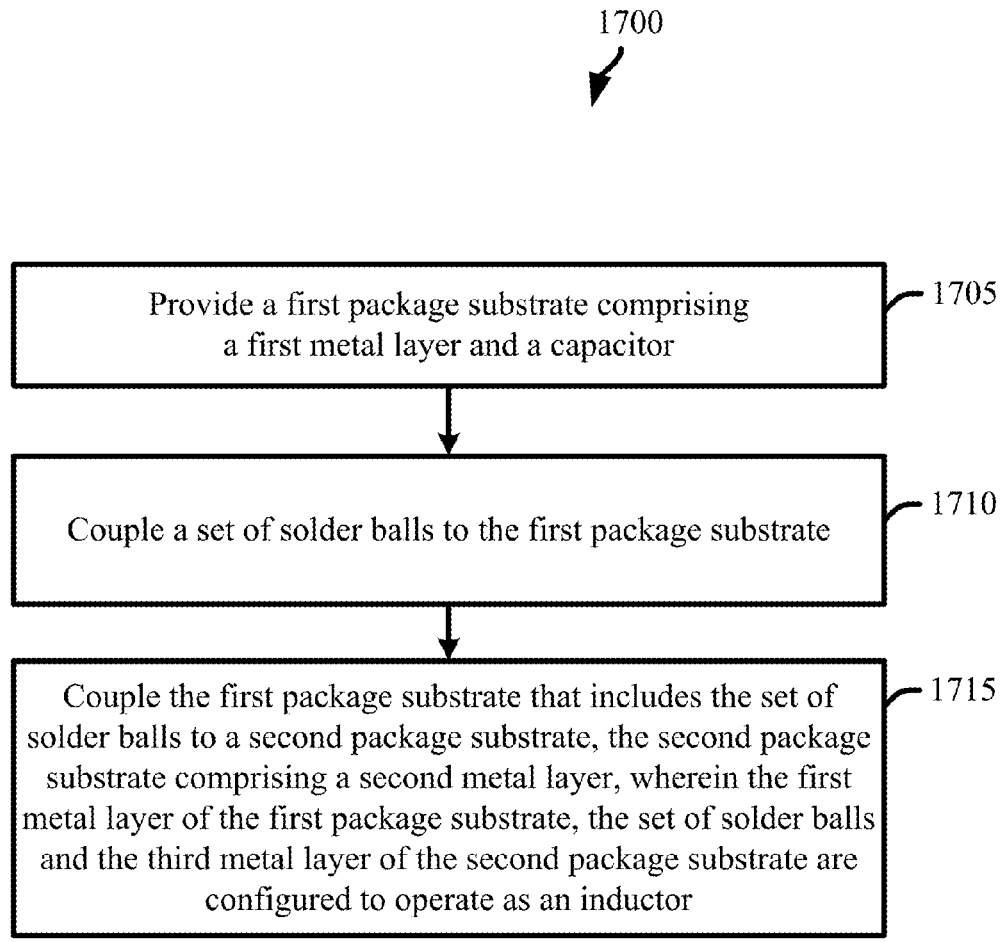
FIG. 17 illustrates a flow diagram for manufacturing/providing an inductor.

FIG. 17 illustrates a flow diagram of a method for fabricating/providing an inductor defined by two package substrates and a set of solder balls, where at least one substrate includes a capacitor. In some implementations, the method of FIG. 17 may be implemented to manufacture/provide the inductor described in FIG. 15.

As shown in FIG. 17, the method provides (at 1705) a first package substrate that includes a first metal layer and a capacitor. In some implementations, the capacitor is a surface mounted passive device. In some implementations, the first package substrate may include additional metal layers (e.g., third metal layer). The package substrate may include one or more dies in some implementations. The method couples (at 1710) a set of solder balls to the first package substrate.

The method further couples (at 1715) the first package substrate that includes the set of solder balls to a second package substrate. The second package substrate includes a second metal layer. In some implementations, the second package substrate may include additional metal layers (e.g., fourth metal layer, fifth metal layer). The second package substrate may also include one or more dies in some implementations. Once the first package substrate is coupled to the second package substrate, the first metal layer of the first package substrate, the set of solder balls and the second metal layer of the second package substrate are configured to operate as an inductor. In some implementations, the additional metal layers of the second package substrate (e.g., fourth metal layer, fifth metal layer) along with the first and third metal layers of the first package substrate, the set of solder balls and the second metal layer of the second package substrate may be configured to operate as an inductor. In some implementations, the inductor is configured to operate with the capacitor as a filter for an electrical signal. In some implementations, the filter is one of at least a trap filter and/or a notch filter. In some implementations, the filter is a high quality factor (Q) filter.

Exemplary Integrated Devices Comprising Capacitor and Part of an Inductor

Figure 18:
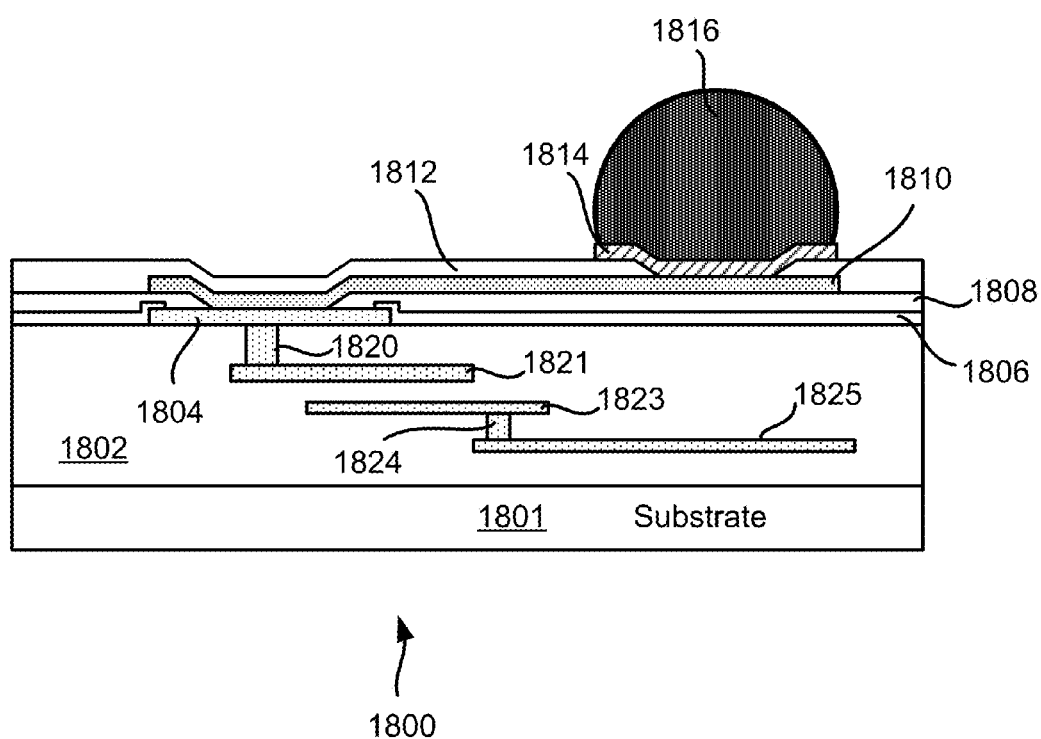
FIG. 18 illustrates a profile view of an integrated device that includes a capacitor and part of an inductor.

FIG. 18 illustrates an example of a profile view of an integrated device 1800 that includes a capacitor and part of an inductor. The integrated device 1800 includes a substrate 1801, several lower level metal and dielectric layers 1802, a pad 1804, a passivation layer 1806, a first insulation layer 1808, a first metal redistribution layer 1810, a second insulation layer 1812, and an under bump metallization (UBM) layer 1814. The integrated device 1800 also includes a solder ball 1816. Specifically, the solder ball 1816 of the integrated device 1800 is coupled to a trace of a printed circuit board (PCB) (not shown). In some implementations, the solder ball 1816, the UBM layer 1814, and/or the redistribution layer 1810 is part of an inductor in the integrated device 1800.

The lower level metal and dielectric layers 1802 includes a capacitor. In some implementations, a capacitor is a passive capacitive means configured to store energy (e.g., store energy electrostatically in an electric field). In some implementations, the capacitor is a metal-insulator-metal (MIM) capacitor. The capacitor includes a first interconnect 1820, a second interconnect 1821, a third interconnect 1823, a fourth interconnect 1824, and a fifth interconnect 1825. In some implementations, the first interconnect 1820 is a first via. In some implementations, the second interconnect 1821 is a first trace. In some implementations, the third interconnect 1823 is a second trace. In some implementations, the fourth interconnect 1824 is a second via. In some implementations, the fifth interconnect 1825 is a third trace. In some implementations, the first interconnect 1820, the second interconnect 1821, the third interconnect 1823, the fourth interconnect 1824, and/or the fifth interconnect 1825 are lower level metal layers in the integrated device 1800 (e.g., die).

Figure 19:
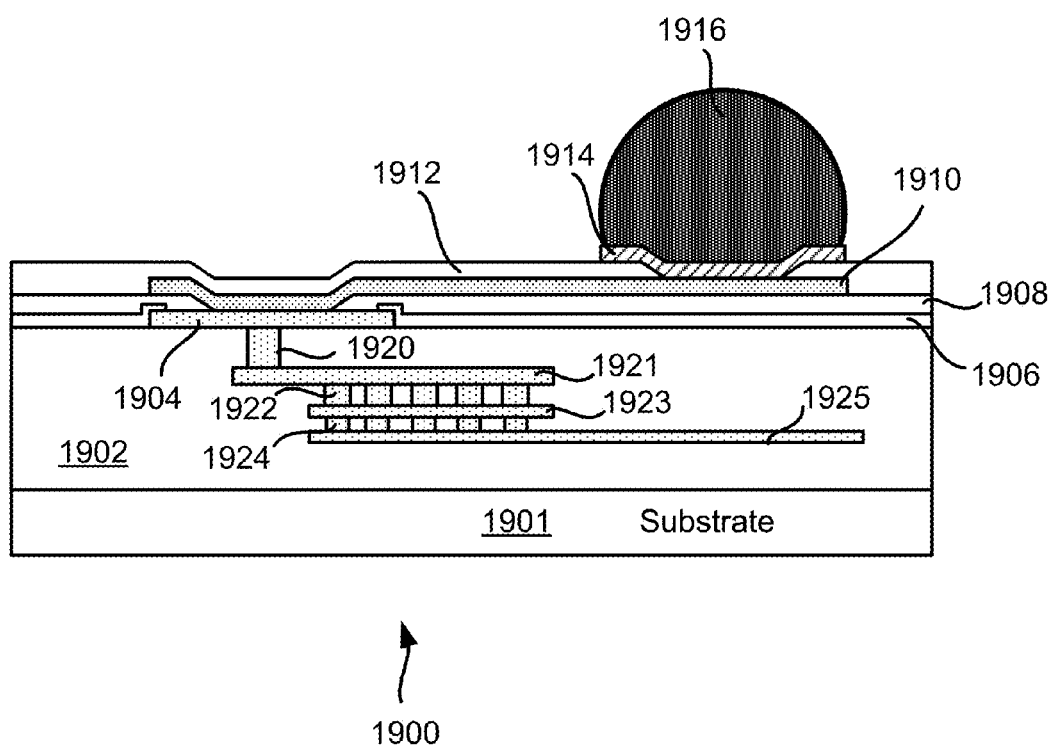
FIG. 19 illustrates a profile view of an integrated device that includes another capacitor and part of an inductor.

FIG. 19 illustrates an example of a profile view of an integrated device 1900 that includes a capacitor and part of an inductor. The integrated device 1900 includes a substrate 1901, several lower level metal and dielectric layers 1902, a pad 1904, a passivation layer 1906, a first insulation layer 1908, a first metal redistribution layer 1910, a second insulation layer 1912, and an under bump metallization (UBM) layer 1914. The integrated device 1900 also includes a solder ball 1916. Specifically, the solder ball 1916 of the integrated device 1900 is coupled to a trace of a printed circuit board (PCB) (not shown). In some implementations, the solder ball 1916, the UBM layer 1914, and/or the redistribution layer 1910 is part of an inductor in the integrated device 1900.

The lower level metal and dielectric layers 1902 includes a capacitor. In some implementations, a capacitor is a passive capacitive means configured to store energy (e.g., store energy electrostatically in an electric field). In some implementations, the capacitor is a metal-on-metal (MOM) capacitor. The capacitor includes a first interconnect 1920, a second interconnect 1921, a third set of interconnect 1922, a fourth interconnect 1923, a fifth set of interconnects 1924, and a sixth interconnect 1925. In some implementations, the first interconnect 1920 is a first via. In some implementations, the second interconnect 1921 is a first trace. In some implementations, the third set of interconnect 1922 is a second set of vias. In some implementations, the fourth interconnect 1923 is a second trace. In some implementations, the fourth set of interconnect 1924 is a third set of vias. In some implementations, the fifth interconnect 1925 is a third trace. In some implementations, the first interconnect 1920, the second interconnect 1921, the third set of interconnect 1922, the fourth interconnect 1923, the fifth set of interconnects 1924, and/or the sixth interconnect 1925 are lower level metal layers in the integrated device 1900 (e.g., die).

Exemplary Sequence for Providing/Fabricating a Die that Includes a Capacitor

FIG. 20 (which includes FIGS. 20A-20D) illustrates an exemplary sequence for providing and/or fabricating an integrated device that includes a capacitor and at least part of an inductor. In some implementations, the sequence of FIGS. 20A-20D may be used to provide and/or fabricate the integrated devices of FIGS. 2-12, 18-19 and/or other integrated devices described in the present disclosure.

Figure 20A:
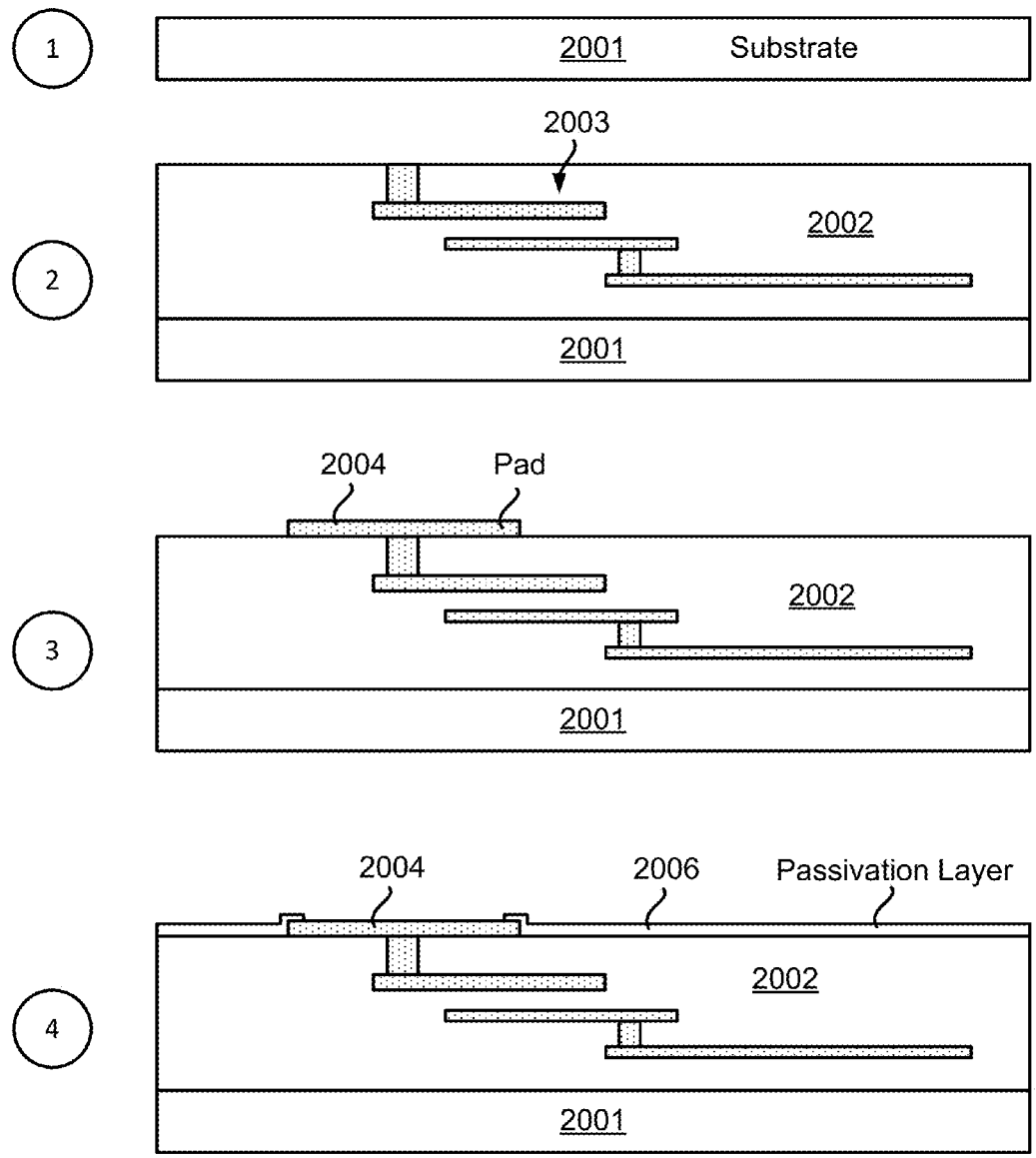
FIG. 20 (comprising FIGS. 20A-20D) illustrates an example of a sequence for fabricating an integrated device that includes a capacitor.

Stage 1 of FIG. 20A, illustrates a stage after a substrate (e.g., substrate 2001) is provided (e.g., formed, fabricated). In some implementations, the substrate is a wafer. Different implementations may use different materials for the substrate (e.g., silicon substrate, glass substrate).

Stage 2 illustrates a state after several lower level metal and dielectric layers (e.g., lower level metal and dielectric layers 2002) are provided (e.g., formed, fabricated) on the substrate 2001. Different implementations may provide different number of lower level metal and dielectric layers (e.g., M1 metal layer, M2 metal layer, M3 metal layer, M4 metal layer, M5 metal layer, M6 metal layer, M7 metal layer). In some implementations, circuits, routes and/or interconnects are also provided in the substrate 2001 and/or the lower level metal and dielectric layers 2002. As shown in stage 2, a capacitor 2003 is provided in the lower level metal and dielectric layers 2002. In some implementations, the capacitor 2003 is metal-insulator-metal (MIM) capacitor as shown in FIG. 18. However, in some implementations, the capacitor 2003 can be other types of capacitors, such as the metal-on-metal (MOM) capacitor of FIG. 19.

Stage 3 illustrates a state after at least one pad (e.g., pad 2004) is provided (e.g., formed, fabricated) on the lower level metal and dielectric layers 2002. In some implementations, the pad is coupled to one of the lower level metal layer (e.g., the top lower level metal layer, M7 metal layer). In some implementations, the pad 2004 is an aluminum pad. However, different implementations may use different materials for the pad 2004. Different implementations may use different processes for providing the pad on the lower level metal and dielectric layers 2002. For example, in some implementations, a lithography and/or etching process may be use to provide the pad 2004 on the lower level metal and dielectric layers 2002.

Stage 4 illustrates a state after a passivation layer (e.g., passivation layer 2006) is provided (e.g., formed, fabricated) on the lower level metal and dielectric layers 2002. Different implementations may use different materials for the passivation layer. As shown in stage 4, the passivation layer 2006 is provided on the lower level metal and dielectric layers 2002 such that at least a portion of the pad 2004 is exposed.

Figure 20B:
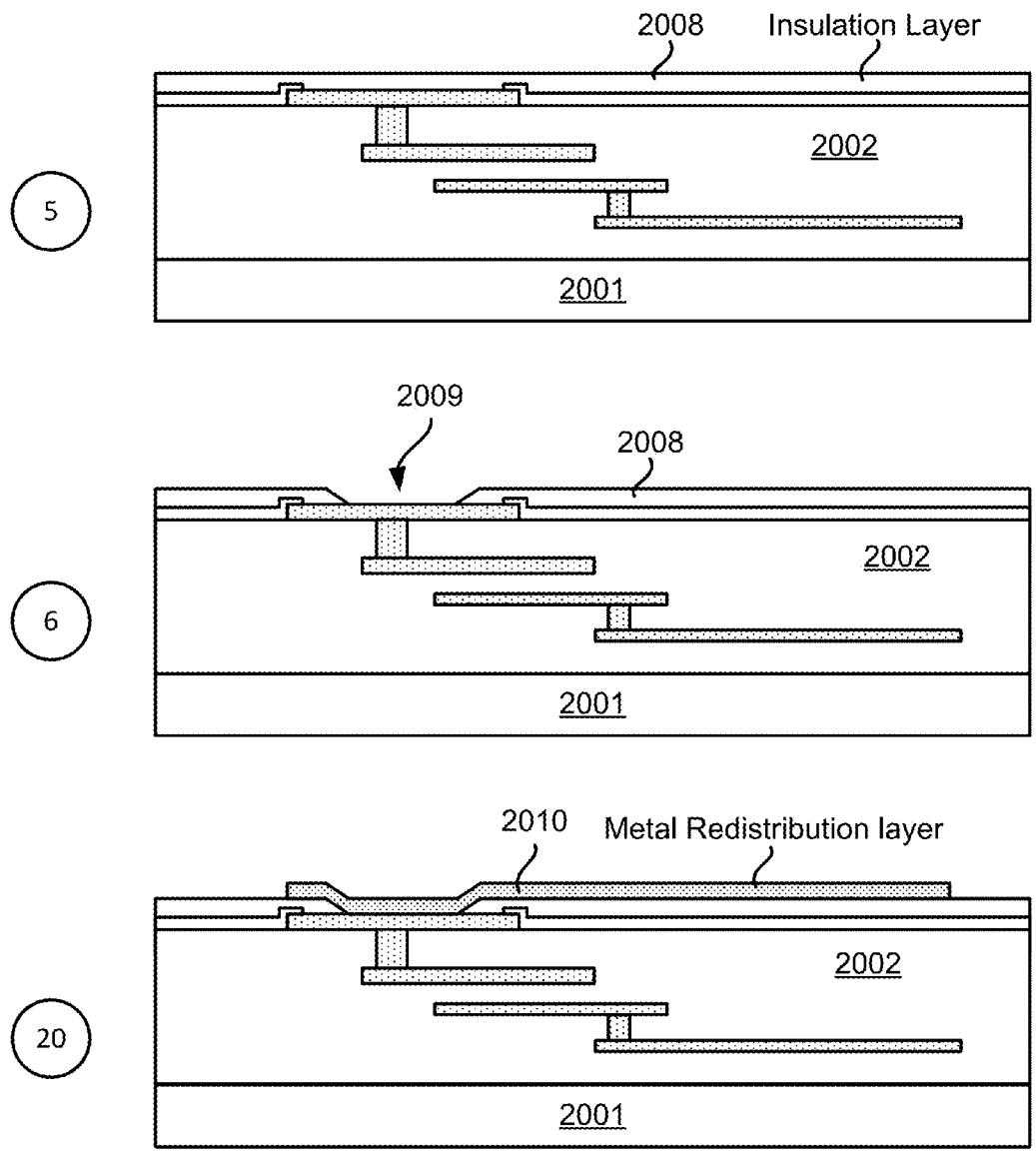

Stage 5 of FIG. 20B, illustrates a state after a first insulation layer (e.g., first insulation layer 2008) is provided (e.g., formed, fabricated) on the passivation layer 2006 and the pad 2004. Different implementations may use different materials for the first insulation layer 2008. For example, the first insulation layer 2008 may be a Polybenzoxazole (PbO) layer or a polymer layer.

Stage 6 illustrates a state after a cavity (e.g., cavity 2009) is provided (e.g., formed, fabricated) in the first insulation layer 2008. As further shown in stage 6, the cavity 2009 is created over the pad 2004. Different implementations may create the cavity 2009 differently. For example, the cavity 2009 may be provided/created by etching the first insulation layer 2008.

Stage 7 illustrates a state after a first metal redistribution layer is provided (e.g., formed, fabricated). Specifically, a first metal redistribution layer 2010 is provided over the pad 2004 and the first insulation layer 2008. As shown in stage 20, the first metal redistribution layer 2010 is coupled to the pad 2004. In some implementations, the first metal redistribution layer 2010 is a copper layer.

Figure 20C:
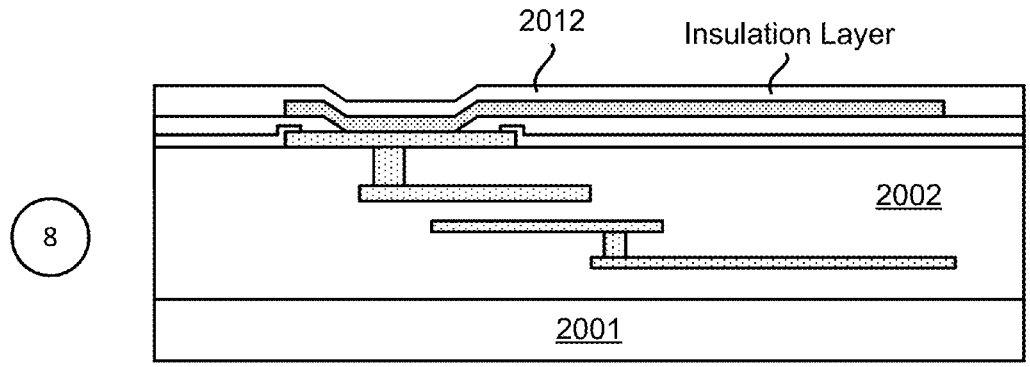
Figure 20C:
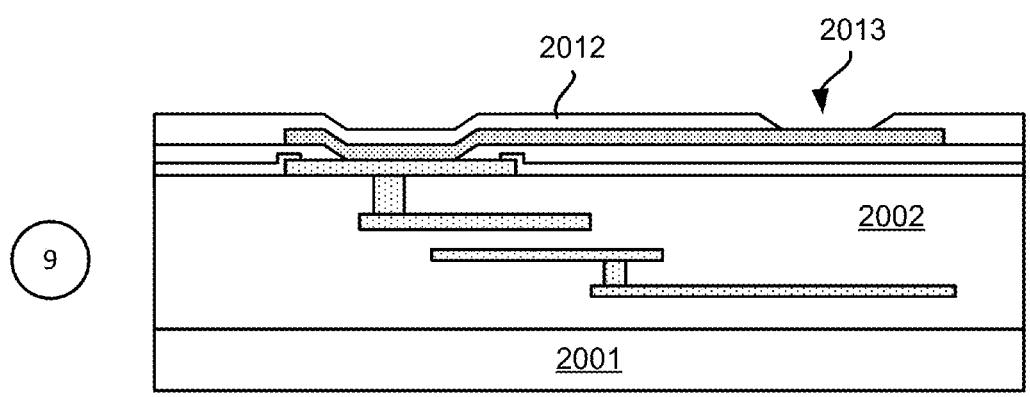
Figure 20D:
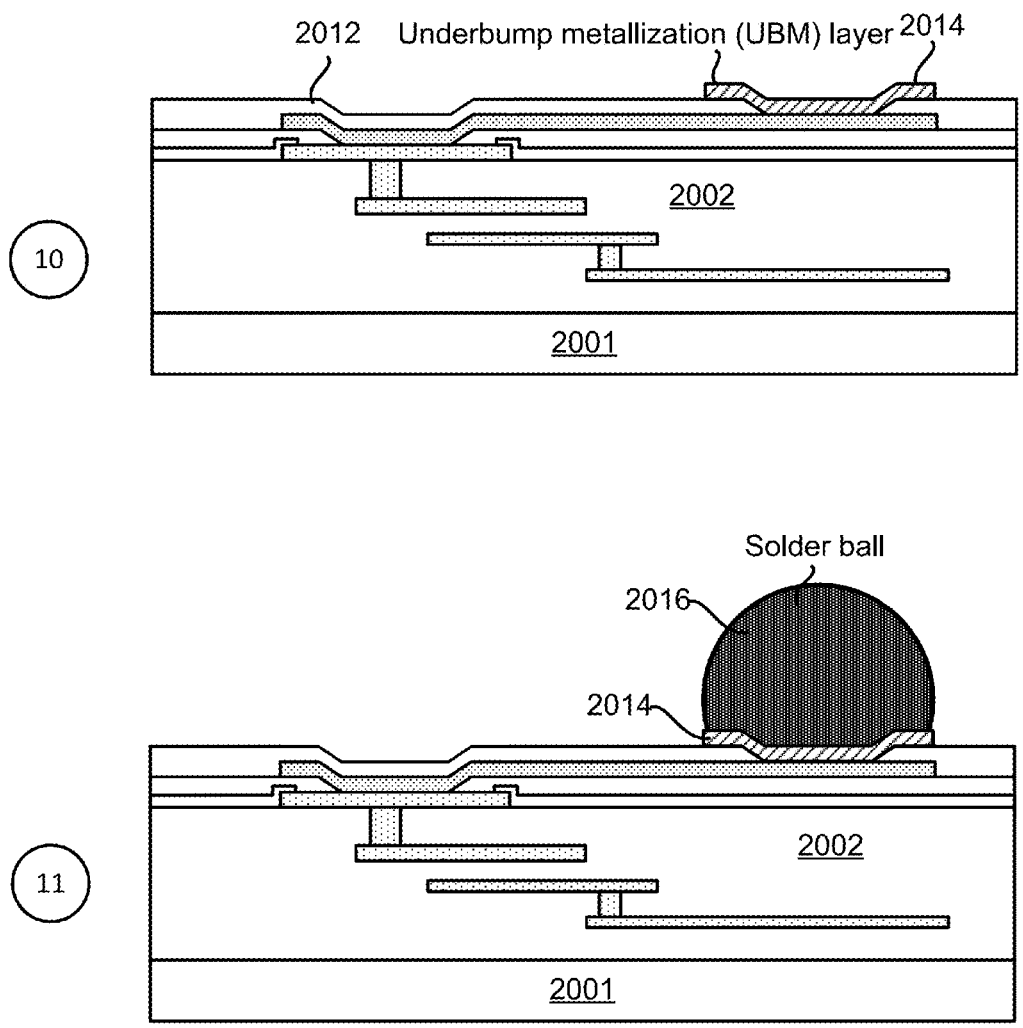

Stage 8 of FIG. 20C, illustrates a state after a second insulation layer (e.g., second insulation layer 2012) is provided (e.g., formed, fabricated) on the first insulation layer 2008 and the first metal redistribution layer 2010. Different implementations may use different materials for the second insulation layer 2012. For example, the second insulation layer 2012 may be a Polybenzoxazole (PbO) layer or a polymer layer.

Stage 9 illustrates a state after a cavity (e.g., cavity 2013) is provided (e.g., formed, fabricated) in the second insulation layer 2012. Different implementations may create the cavity 2013 differently. For example, the cavity 2013 may be provided/created by etching the second insulation layer 2012.

Stage 10 illustrates a state after an under bump metallization (UBM) layer is provided (e.g., formed, fabricated). Specifically, an under bump metallization (UBM) layer 2014 is provided in the cavity 2013 of the second insulation layer 2012. As shown at stage 21, the UBM layer 2014 is coupled to the first metal redistribution layer 2010. In some implementations, the UBM layer 2014 is a copper layer.

Stage 11 illustrates a state after a solder ball is provided on the UBM layer. Specifically, a solder ball 2016 is coupled to the UBM layer 2014. In some implementations, the solder ball 2016, the UBM layer 2014, and/or the redistribution layer 2010 is part of an inductor in the integrated device.

Figure 21:
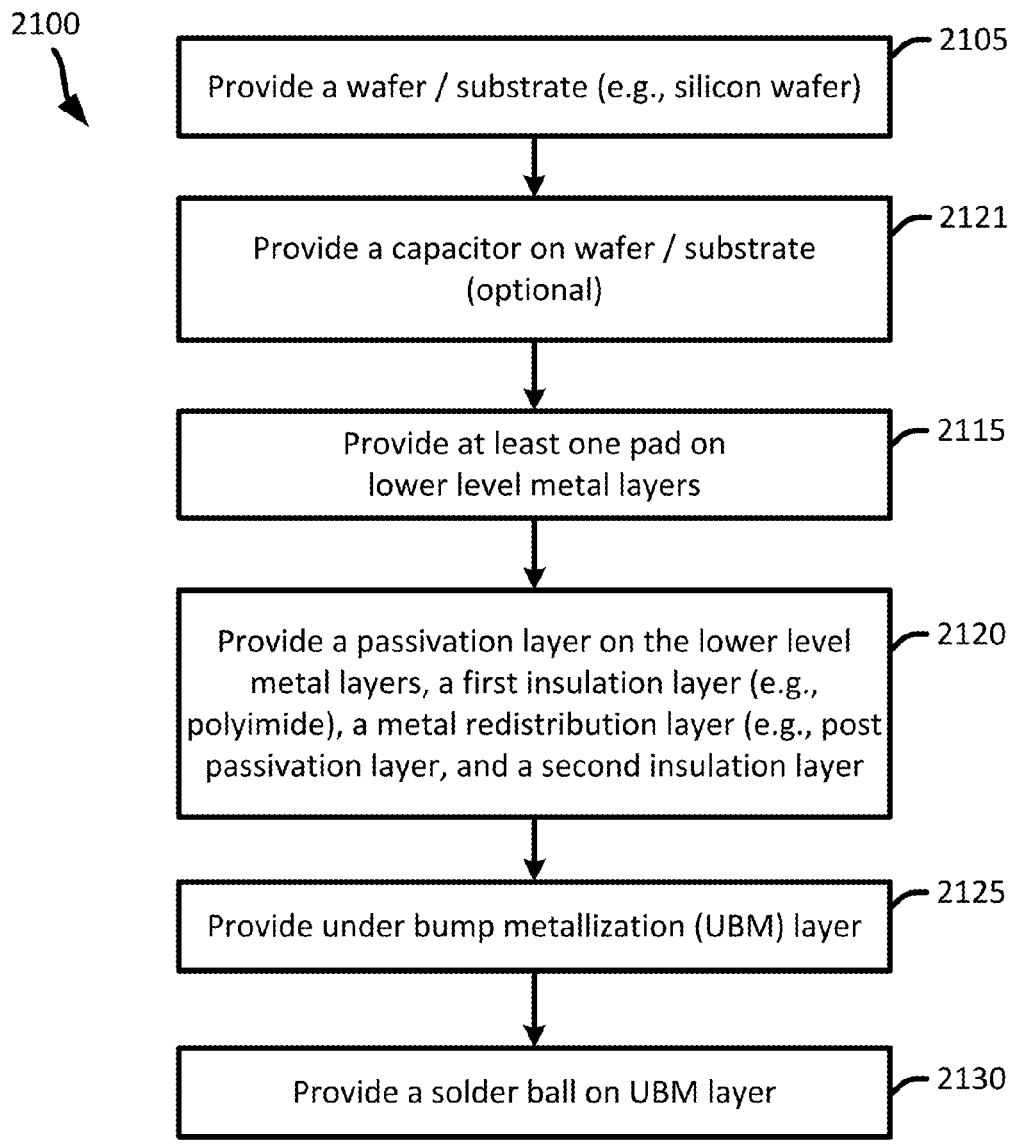
FIG. 21 illustrates a flow diagram of a method for fabricating an integrated device that includes a capacitor.

Exemplary Flow Diagram of a Method for Providing/Fabricating a Die that Includes a Capacitor FIG. 21 illustrates an exemplary flow diagram of a method for providing and/or fabricating an integrated device that includes a capacitor. In some implementations, the flow diagram of FIG. 21 may be used to provide and/or fabricate the integrated devices of FIGS. 2, 6 or other integrated devices described in the present disclosure.

The method provides (at 2105) a substrate. In some implementations, providing (at 2105) the substrate includes providing a wafer (e.g., silicon wafer). However, different implementations may use different materials for the substrate (e.g., glass substrate). The method then optionally provides (at 2110) a capacitor (e.g., MIM capacitor, MOM capacitor) in lower level metal layers.

The method further provides (at 2115) at least one pad on one of the lower level metal and dielectric layers (e.g., M7 metal layer). In some implementations, providing (at 2115) the pad includes coupling the pad to one of the lower level metal layer (e.g., the top lower level metal layer, M7 metal layer). In some implementations, the pad is an aluminum pad. However, different implementations may use different materials for the pad. In addition, different implementations may use different processes for providing the pad on the lower level metal and dielectric layers. For example, in some implementations, a lithography and/or etching process may be use to provide (at 2115) the pad on the lower level metal and dielectric layers.

The method provides (at 2120) a passivation layer (e.g., passivation layer 2306), a first insulation layer (e.g., first insulation layer 2308), a redistribution layer (e.g., redistribution layer 2310), and a second insulation layer (e.g., second insulation layer 2312). Different implementations may use different materials for the passivation layer. In some implementations, the passivation layer is provided on the lower level metal and dielectric layers such that at least a portion of the pad is exposed. In some implementations, the metal redistribution layer is provided over the pad and the first insulation layer. In some implementations, the metal redistribution layer is coupled to the pad. In some implementations, the metal redistribution layer is a copper layer.

Different implementations may use different materials for the first and second insulation layers. For example, the first and second insulation layers may be a Polybenzoxazole (PbO) layer and/or a polymer layer.

The method then provides (at 2125) an under bump metallization (UBM) layer. In some implementations, providing (at 2125) the UBM layer includes coupling the UBM layer to the metal redistribution layer. In some implementations, the UBM layer is a copper layer. The method further provides (at 2135) a solder ball on the UBM layer.

Different implementations may use different processes to form and/or fabricate the metal layers (e.g., redistribution layer, under bump metallization layer, protrusion). In some implementations, these processes include a semi-additive patterning (SAP) process and a damascene process. These various different processes are further described below.

Exemplary Semi-Additive Patterning (SAP) Process

Figure 22:
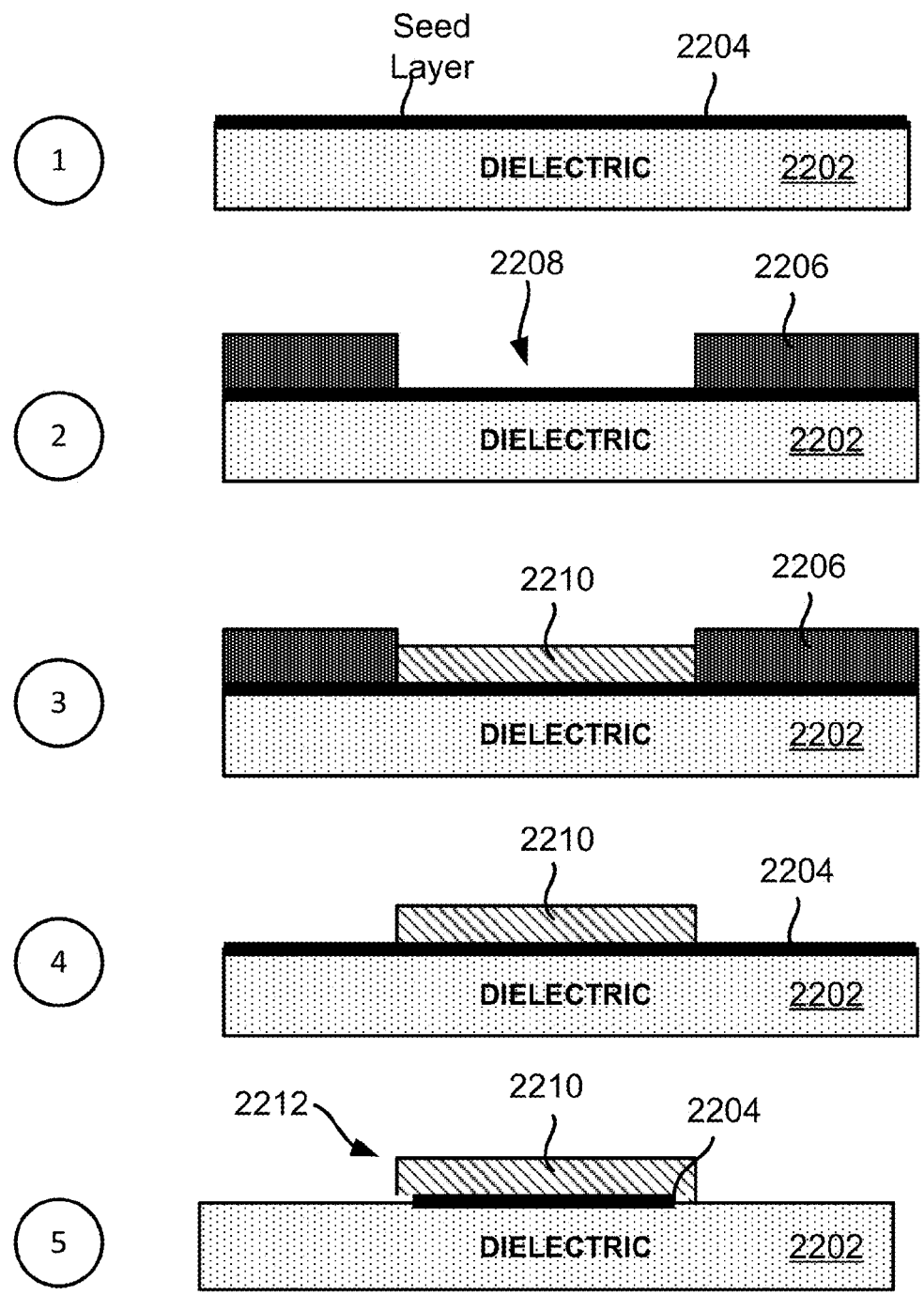
FIG. 22 illustrates an example of a semi-additive patterning (SAP) process.

FIG. 22 illustrates a sequence for forming an interconnect using a semi-additive patterning (SAP) process to provide and/or form an interconnect (e.g., redistribution layer, under bump metallization layer, protrusion) in one or more dielectric layer(s). As shown in FIG. 22, stage 1 illustrates a state of an integrated device (e.g., substrate) after a dielectric layer 2202 is provided (e.g., formed). In some implementations, stage 1 illustrates that the dielectric layer 2202 includes a first metal layer 2204. The first metal layer 2204 is a seed layer in some implementations. In some implementations, the first metal layer 2204 may be provided (e.g., formed) on the dielectric layer 2202 after the dielectric layer 2202 is provided (e.g., received or formed). Stage 1 illustrates that the first metal layer 2204 is provided (e.g., formed) on a first surface of the dielectric layer 2202. In some implementations, the first metal layer 2204 is provided by using a deposition process (e.g., PVD, CVD, plating process).

Stage 2 illustrates a state of the integrated device after a photo resist layer 2206 (e.g., photo develop resist layer) is selectively provided (e.g., formed) on the first metal layer 2204. In some implementations, selectively providing the resist layer 2206 includes providing a first resist layer 2206 on the first metal layer 2204 and selectively removing portions of the resist layer 2206 by developing (e.g., using a development process). Stage 2 illustrates that the resist layer 2206 is provided such that a cavity 2208 is formed.

Stage 3 illustrates a state of the integrated device after a second metal layer 2210 is formed in the cavity 2208. In some implementations, the second metal layer 2210 is formed over an exposed portion of the first metal layer 2204. In some implementations, the second metal layer 2210 is provided by using a deposition process (e.g., plating process).

Stage 4 illustrates a state of the integrated device after the resist layer 2206 is removed. Different implementations may use different processes for removing the resist layer 2206.

Stage 5 illustrates a state of the integrated device after portions of the first metal layer 2204 are selectively removed. In some implementations, one or more portions of the first metal layer 2204 that is not covered by the second metal layer 2206 is removed. As shown in stage 5, the remaining first metal layer 2202 and the second metal layer 2210 may form and/or define an interconnect 2212 (e.g., trace, vias, pads) in an integrated device and/or a substrate. In some implementations, the first metal layer 2206 is removed such that a dimension (e.g., length, width) of the first metal layer 2206 underneath the second metal layer 2210 is smaller than a dimension (e.g., length, width) of the second metal layer 2210, which can result in an undercut, as shown at stage 5 of FIG. 22. In some implementations, the above mentioned processes may be iterated several times to provide and/or form several interconnects in one or more dielectric layers of an integrated device and/or substrate.

Figure 23:
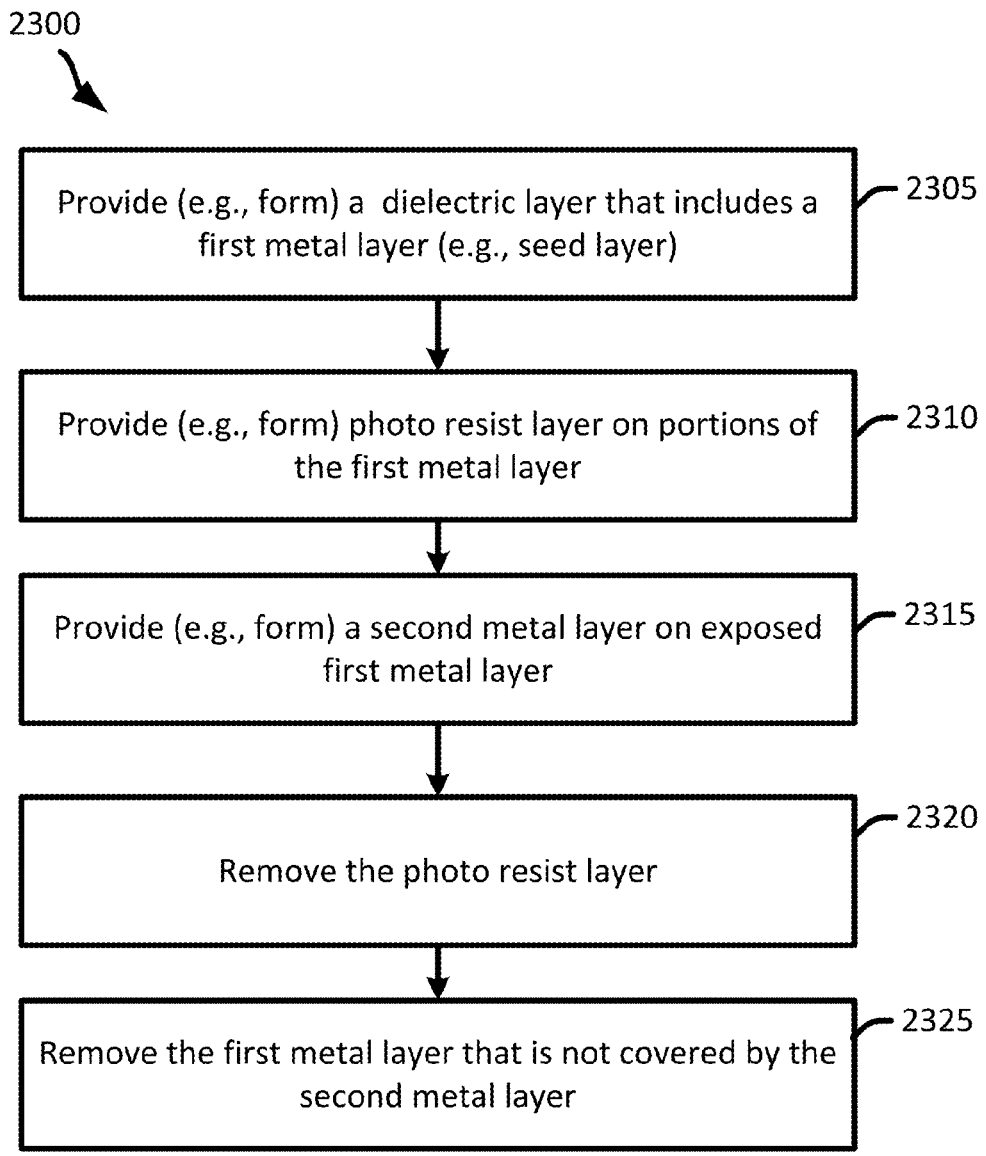
FIG. 23 illustrates an example of flow diagram of a semi-additive patterning (SAP) process.

FIG. 23 illustrates a flow diagram for a method for using a (SAP) process to provide and/or form an interconnect (e.g., redistribution layer, under bump metallization layer, protrusion) in one or more dielectric layer(s). The method provides (at 2305) a dielectric layer (e.g., dielectric layer 2202). In some implementations, providing the dielectric layer includes forming the dielectric layer. In some implementations, providing the dielectric layer includes forming a first metal layer (e.g., first metal layer 2204). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 2310) a photo resist layer (e.g., a photo develop resist layer 2206) on the first metal layer. In some implementations, selectively providing the resist layer includes providing a first resist layer on the first metal layer and selectively removing portions of the resist layer (which provides one or more cavities).

The method then provides (at 2315) a second metal layer (e.g., second metal layer 2210) in the cavity of the photo resist layer. In some implementations, the second metal layer is formed over an exposed portion of the first metal layer. In some implementations, the second metal layer is provided by using a deposition process (e.g., plating process).

The method further removes (at 2320) the resist layer. Different implementations may use different processes for removing the resist layer. The method also selectively removes (at 2325) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 24:
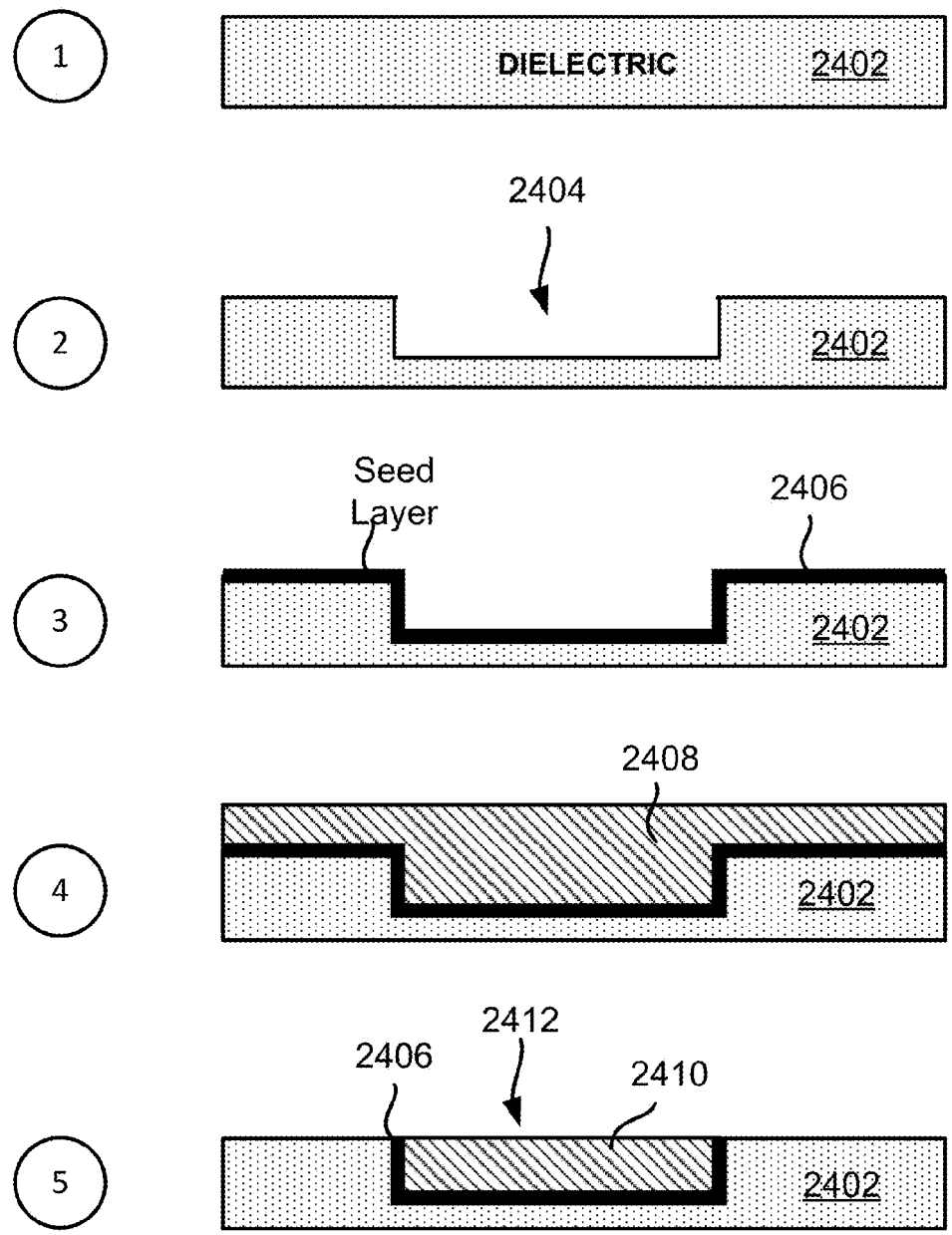
FIG. 24 illustrates an example of a damascene process.

FIG. 24 illustrates a sequence for forming an interconnect using a damascene process to provide and/or form an interconnect (e.g., redistribution layer, under bump metallization layer, protrusion) in a dielectric layer. As shown in FIG. 24, stage 1 illustrates a state of an integrated device after a dielectric layer 2402 is provided (e.g., formed). In some implementations, the dielectric layer 2402 is an inorganic layer (e.g., inorganic film).

Stage 2 illustrates a state of an integrated device after a cavity 2404 is formed in the dielectric layer 2402. Different implementations may use different processes for providing the cavity 2404 in the dielectric layer 2402.

Stage 3 illustrates a state of an integrated device after a first metal layer 2406 is provided on the dielectric layer 2402. As shown in stage 3, the first metal layer 2406 provided on a first surface of the dielectric later 2402. The first metal layer 2406 is provided on the dielectric layer 2402 such that the first metal layer 2406 takes the contour of the dielectric layer 2402 including the contour of the cavity 2404. The first metal layer 2406 is a seed layer in some implementations. In some implementations, the first metal layer 2406 is provided by using a deposition process (e.g., physical vapor deposition (PVD), Chemical Vapor Deposition (CVP) or plating process).

Stage 4 illustrates a state of the integrated device after a second metal layer 2408 is formed in the cavity 2404 and a surface of the dielectric layer 2402. In some implementations, the second metal layer 2408 is formed over an exposed portion of the first metal layer 2406. In some implementations, the second metal layer 2408 is provided by using a deposition process (e.g., plating process).

Stage 5 illustrates a state of the integrated device after the portions of the second metal layer 2408 and portions of the first metal layer 2406 are removed. Different implementations may use different processes for removing the second metal layer 2408 and the first metal layer 2406. In some implementations, a chemical mechanical planazation (CMP) process is used to remove portions of the second metal layer 2408 and portions of the first metal layer 2406. As shown in stage 5, the remaining first metal layer 2406 and the second metal layer 2408 may form and/or define an interconnect 2412 (e.g., trace, vias, pads) in an integrated device and/or a substrate. As shown in stage 5, the interconnect 2412 is formed in such a way that the first metal layer 2406 is formed on the base portion and the side portion(s) of the second metal layer 2410. In some implementations, the cavity 2404 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 25:
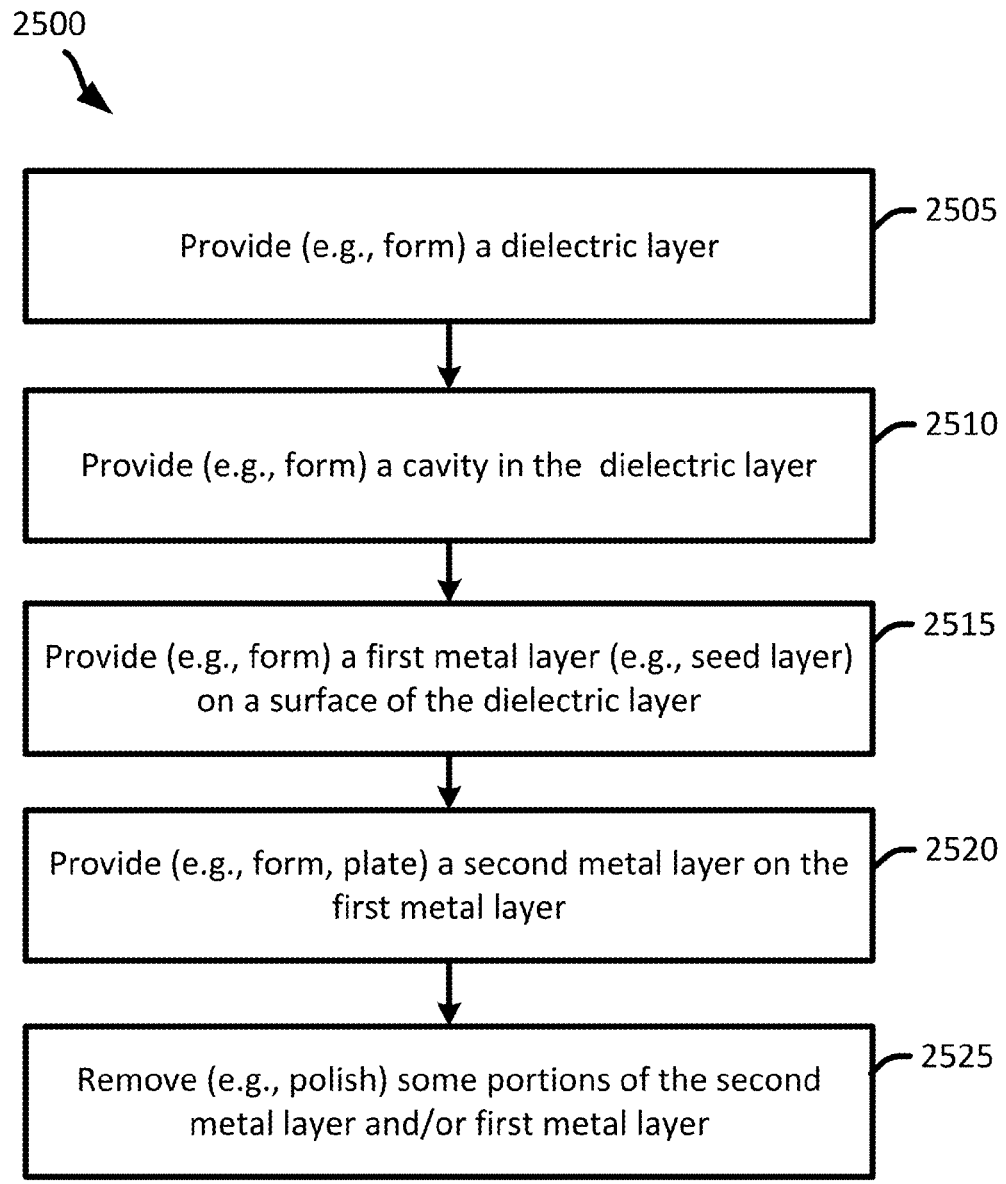
FIG. 25 illustrates an example of a flow diagram of a damascene process.

FIG. 25 illustrates a flow diagram of a method for forming an interconnect using a damascene process to provide and/or form an interconnect (e.g., redistribution layer, under bump metallization layer, protrusion) in a dielectric layer. The method provides (at 2505) a dielectric layer (e.g., dielectric layer 2402). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 2510) at least one cavity (e.g., cavity 2404) in the dielectric layer. Different implementations may use different processes for providing the cavity in the dielectric layer.

The method provides (at 2515) a first metal layer (e.g., first metal layer 2406) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 2406 is provided by using a deposition process (e.g., PVD, CVD or plating process).

The method provides (at 2520) a second metal layer (e.g., second metal layer 2408) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 2525) portions of the second metal layer and portions of the first metal layer. Different implementations may use different processes for removing the second metal layer and the first metal layer. In some implementations, a chemical mechanical planazation (CMP) process is used to remove portions of the second metal layer and portions of the first metal layer. In some implementations, the remaining first metal layer and the second metal layer may form and/or define an interconnect (e.g., interconnect 2412). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 26:
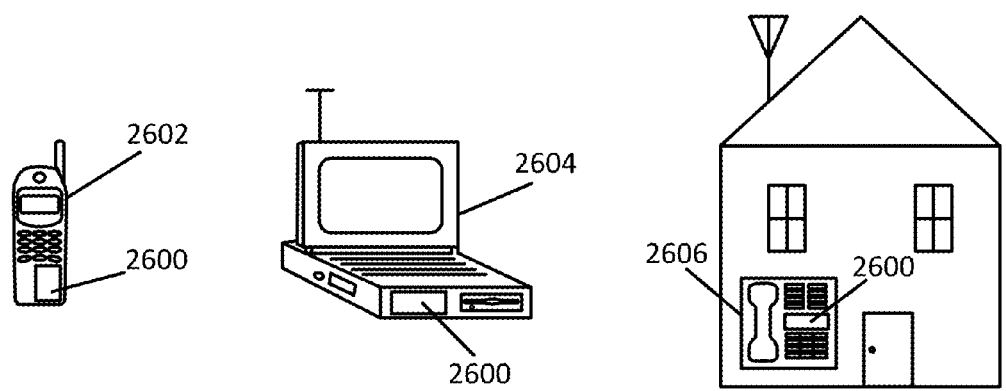
FIG. 26 illustrates various electronic devices that may integrate an integrated device, a die, an integrated circuit and/or PCB described herein.

FIG. 26 illustrates various electronic devices that may be integrated with any of the aforementioned integrated device, semiconductor device, integrated circuit, die, interposer or package. For example, a mobile telephone 2602, a laptop computer 2604, and a fixed location terminal 2606 may include an integrated device 2600 as described herein. The integrated device 2600 may be, for example, any of the integrated circuits, substrates, dies, package or package-on-package (PoP) devices described herein. The devices 2602, 2604, 2606 illustrated in FIG. 26 are merely exemplary. Other electronic devices may also feature the integrated device 2600 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17, 18, 19, 20A-20D, 21, 22, 23, 24, 25, and/or 26 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14, 15, 16, 17, 18, 19, 20A-20D, 21, 22, 23, 24, 25, and/or 26 and its corresponding description in the present disclosure is not limited to dies and/or ICs. In some implementations, FIGS. 2, 3, 4, 5, 6, 7, 8, 9, 10, 11, 12, 13, 14, 15, 16, 17, 18, 19, 20A-20D, 21, 22, 23, 24, 25, and/or 26 and its corresponding description may be used to manufacture, create, provide, and/or produce integrated devices. In some implementations, an integrated device may include a die package, an integrated circuit (IC), a wafer, a semiconductor device, substrate and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
a capacitor; and
an inductor electrically coupled to the capacitor, wherein the inductor and the capacitor are configured to operate as a filter for an electrical signal in the integrated device, the inductor comprising:
a first metal layer of a printed circuit board (PCB);
a set of solder balls coupled to the PCB; and
a second metal layer in a die.

2. The integrated device of claim 1, wherein the capacitor is located in the die.

3. The integrated device of claim 1, wherein the capacitor is one of at least a metal-insulator-metal (MIM) capacitor, and/or metal-on-metal (MOM) capacitor.

4. The integrated device of claim 1, wherein the capacitor is a surface mounted passive device on the PCB.

5. The integrated device of claim 1, wherein the first metal layer is a trace on the PCB.

6. The integrated device of claim 1, wherein the second metal layer is an under bump metallization (UBM) layer of the die.

7. The integrated device of claim 1, wherein the inductor further comprises a third metal layer in the die.

8. The integrated device of claim 7, wherein the second metal layer is an under bump metallization (UBM) layer of the die, and the third metal layer is a redistribution layer of the die.

9. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

10. An apparatus comprising:
a passive capacitive means configured to store electrical energy; and
an inductor electrically coupled to the passive capacitive means, wherein the inductor and the passive capacitive means are configured to operate as a filter for an electrical signal in an integrated device, the inductor comprising:
a first metal layer of a printed circuit board (PCB);
a set of solder balls coupled to the PCB; and
a second metal layer in a die.

11. The apparatus of claim 10, wherein the passive capacitive means is located in the die.

12. The apparatus of claim 10, wherein the passive capacitive means is one of at least a metal-insulator-metal (MIM) capacitor, and/or metal-on-metal (MOM) capacitor.

13. The apparatus of claim 10, wherein the passive capacitive means is a surface mounted passive device on the PCB.

14. The apparatus of claim 10, wherein the first metal layer is a trace on the PCB.

15. The apparatus of claim 10, wherein the second metal layer is an under bump metallization (UBM) layer of the die.

16. The apparatus of claim 10, wherein the inductor further comprises a third metal layer in the die.

17. The apparatus of claim 16, wherein the second metal layer is an under bump metallization (UBM) layer of the die, and the third metal layer is a redistribution layer of the die.

18. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

19. A method for fabricating an integrated device, comprising:
providing a capacitor; and
providing an inductor such that the inductor is electrically coupled to the capacitor, wherein the inductor and the capacitor are configured to operate as a filter for an electrical signal in the integrated device, wherein providing the inductor comprises:
forming a first metal layer of a printed circuit board (PCB);
providing a set of solder balls coupled to the PCB; and
forming a second metal layer in a die.

20. The method of claim 19, wherein the capacitor is located in the die.

21. The method of claim 19, wherein the capacitor is one of at least a metal-insulator-metal (MIM) capacitor, and/or metal-on-metal (MOM) capacitor.

22. The method of claim 19, wherein the capacitor is a surface mounted passive device on the PCB.

23. The method of claim 19, wherein the first metal layer is a trace on the PCB.

24. The method of claim 19, wherein the second metal layer is an under bump metallization (UBM) layer of the die.

25. The method of claim 19, wherein providing the inductor further comprises forming a third metal layer in the die.

26. The method of claim 25, wherein the second metal layer is an under bump metallization (UBM) layer of the die, and the third metal layer is a redistribution layer of the die.

27. The method of claim 19, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

28. An integrated device comprising:
a capacitor; and
an inductor electrically coupled to the capacitor, wherein the inductor and the capacitor are configured to operate as a filter for an electrical signal in the integrated device, the inductor comprising:
a first metal layer of a substrate;
a set of solder balls coupled to the substrate; and
a second metal layer in a die.

29. The integrated device of claim 28, wherein the capacitor is located in the die.

30. The integrated device of claim 28, wherein the capacitor is one of at least a metal-insulator-metal (MIM) capacitor, and/or metal-on-metal (MOM) capacitor.

31. The integrated device of claim 28, wherein the capacitor is a surface mounted passive device on the substrate.

32. The integrated device of claim 28, wherein the first metal layer is a trace on the substrate.

33. The integrated device of claim 28, wherein the substrate is one of at least a package substrate and/or an interposer.

34. The integrated device of claim 28, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

35. An apparatus comprising:
   a passive capacitive means configured to store electrical energy; and
   an inductor electrically coupled to the passive capacitive means, wherein the inductor and the passive capacitive means are configured to operate as a filter for an electrical signal in an integrated device, the inductor comprising:
      a first metal layer of a substrate;
      a set of solder balls coupled to the substrate; and
      a second metal layer in a die.

36. The apparatus of claim 35, wherein the passive capacitive means is located in the die.

37. The apparatus of claim 35, wherein the passive capacitive means is one of at least a metal-insulator-metal (MIM) capacitor, and/or metal-on-metal (MOM) capacitor.

38. The apparatus of claim 35, wherein the passive capacitive means is a surface mounted passive device on the substrate.

39. The apparatus of claim 35, wherein the substrate is one of at least a package substrate and/or an interposer.

40. The apparatus of claim 35, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

41. A method for fabricating an integrated device, comprising:
   providing a capacitor; and
   providing an inductor such that the inductor is electrically coupled to the capacitor, wherein the inductor and the capacitor are configured to operate as a filter for an electrical signal in the integrated device, wherein providing the inductor comprises:
      forming a first metal layer of a substrate;
      providing a set of solder balls coupled to the substrate; and
      forming a second metal layer in a die.

42. The method of claim 41, wherein the capacitor is located in the die.

43. The method of claim 41, wherein the capacitor is one of at least a metal-insulator-metal (MIM) capacitor, and/or metal-on-metal (MOM) capacitor.

44. The method of claim 41, wherein the capacitor is a surface mounted passive device on the substrate.

45. The method of claim 41, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *